(12) United States Patent
Atkins

(10) Patent No.: US 8,065,627 B2
(45) Date of Patent: Nov. 22, 2011

(54) SINGLE PASS AUTOMATIC PHOTO ALBUM PAGE LAYOUT

(75) Inventor: C. Brian Atkins, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 2210 days.

(21) Appl. No.: 10/675,823

(22) Filed: Sep. 30, 2003

(65) Prior Publication Data

US 2005/0071781 A1   Mar. 31, 2005

(51) Int. Cl.
G06F 3/048 (2006.01)
G06F 3/00 (2006.01)

(52) U.S. Cl. ........ 715/788; 715/790; 715/792; 715/798; 715/854

(58) Field of Classification Search .................. 715/854, 715/788, 789, 790, 792, 798, 799, 800, 853
See application file for complete search history.

(56) References Cited

U.S. PATENT DOCUMENTS

| | | | |
|---|---|---|---|
| 5,136,686 A * | 8/1992 | Koza ............................... 706/13 |
| 5,499,366 A | 3/1996 | Rosenberg et al. |
| 5,555,362 A | 9/1996 | Yamashita et al. |
| 5,712,995 A | 1/1998 | Cohn |
| 5,729,254 A | 3/1998 | Marks et al. |
| 5,760,786 A | 6/1998 | Marks et al. |
| 5,920,315 A | 7/1999 | Santos-Gomez |
| 5,956,738 A | 9/1999 | Shirakawa |
| 6,008,809 A | 12/1999 | Brooks |
| 6,301,586 B1 | 10/2001 | Yang et al. |
| 6,380,954 B1 | 4/2002 | Gunther |
| 6,415,306 B2 | 7/2002 | Seaman |
| 6,448,956 B1 | 9/2002 | Berman et al. |
| 6,563,602 B1 | 5/2003 | Uratani et al. |
| 6,636,648 B2 | 10/2003 | Loui et al. |
| 6,636,650 B1 | 10/2003 | Long et al. |
| 6,701,306 B1 * | 3/2004 | Kronmiller et al. ............. 707/2 |
| 6,727,909 B1 | 4/2004 | Matsumura et al. |
| 6,771,292 B2 | 8/2004 | Sharp |

(Continued)

FOREIGN PATENT DOCUMENTS

EP    1186992 A2    3/2002

(Continued)

OTHER PUBLICATIONS

Wong, D.F. and Liu, C. L., "A New ALgorithm for Floorplan Design," Proceeding of the 23rd IEEE Design Automation Conference, Las Vegas, NV, 1986.

(Continued)

Primary Examiner — Nicholas Augustine

(57) ABSTRACT

A method for quickly and efficiently locating objects, such as images having fixed aspect ratios, within a predefined space, such as a printed page, is provided. The method comprises generating a binary tree containing a first image. The system generates a second tree, where the second tree modifies the first tree by inserting a second image at a location or position on the first tree. This iterative process of inserting images one at a time continues until the system generates a final tree including all images. In each iteration, the position in the binary tree where the system inserts each subsequent image can be either a leaf or a node. The system generates a series of candidate trees, one for each subsequent image inserted into each and every location in the preceding tree, and the candidate tree having a highest score indicates the selected location for the subsequent image and the new baseline, preferred binary tree.

21 Claims, 19 Drawing Sheets

U.S. PATENT DOCUMENTS

| | | | |
|---|---|---|---|
| 6,771,801 B1 | 8/2004 | Fisher et al. | |
| 7,013,432 B2 | 3/2006 | Taylor et al. | |
| 7,093,263 B1 * | 8/2006 | Sexton et al. | 719/316 |
| 7,096,445 B1 * | 8/2006 | Pucci et al. | 716/8 |
| 7,124,360 B1 | 10/2006 | Drenttel et al. | |
| 7,148,990 B2 | 12/2006 | Atkins et al. | |
| 7,149,968 B1 | 12/2006 | Ackerschewski et al. | |
| 2002/0051208 A1 * | 5/2002 | Venable | 358/1.18 |
| 2002/0070982 A1 | 6/2002 | Hill et al. | |
| 2002/0122067 A1 | 9/2002 | Geigel et al. | |
| 2002/0145603 A1 * | 10/2002 | Iwasaki | 345/419 |
| 2003/0001879 A1 | 1/2003 | Lin et al. | |
| 2004/0054668 A1 * | 3/2004 | Watanabe et al. | 707/3 |
| 2004/0128284 A1 * | 7/2004 | Watanabe et al. | 707/3 |
| 2005/0071781 A1 | 3/2005 | Atkins | |
| 2005/0071783 A1 | 3/2005 | Atkins | |
| 2005/0240865 A1 | 10/2005 | Atkins et al. | |
| 2006/0200758 A1 | 9/2006 | Atkins | |
| 2006/0279566 A1 | 12/2006 | Atkins | |

FOREIGN PATENT DOCUMENTS

| | | |
|---|---|---|
| EP | 1503336 A2 | 2/2005 |
| GB | 2378340 A | 2/2003 |
| JP | 01-191270 | 1/1989 |
| JP | 09-185728 | 7/1997 |
| JP | 10-293838 | 11/1998 |
| JP | 2002-288669 | 4/2002 |
| JP | 2002-142092 | 5/2002 |
| JP | 2003-101749 | 4/2003 |
| JP | 2003-274139 | 9/2003 |
| WO | WO 98/10356 A2 | 3/1998 |
| WO | WO 01/39019 A2 | 5/2001 |
| WO | WO02/37939 A2 | 5/2002 |
| WO | WO 02/084582 | 10/2002 |

OTHER PUBLICATIONS

Goldenberg, Edan, "Automatic Layout of Variabnle Content Print Data," MSc Dissertation, School of Cognitive Computing Sciences, University of Sussex, Brighton, UK, Aug. 2002.

Joe Geigel et al., "Automatic page layout using genetic algorithms for electronic albuming," Proceedings of Electronic Imaging 2001 (Jan. 2001).

Eldan Goldenberg, "Automatic layout of variable-content print data," MCs Dissertation, School of Cognitive & Computing Sciences, Univeristy of Sussex, Brighton, UK (2002).

D.F. Wong et al., "A new algorithm for floorplan design," Proc. Design Automation Conference, pp. 101-107, 1986.

* cited by examiner

SINGLE PASS AUTOMATIC PHOTO ALBUM PAGE LAYOUT

CROSS-REFERENCE TO RELATED APPLICATIONS

This application also relates to the following co-pending applications:
- U.S. patent application Ser. No. 10/675,724, filed Sep. 30, 2003;
- U.S. patent application Ser. No. 11/769,671, filed Jun. 27, 2007;
- U.S. patent application Ser. No. 11/127,326, filed May 12, 2005;
- U.S. patent application Ser. No. 11/128,543, filed May 12, 2005;
- U.S. patent application Ser. No. 10/831,436, filed Apr. 23, 2004;
- U.S. patent application Ser. No. 11/126,637, filed Apr. 15, 2005;
- U.S. patent application Ser. No. 11/151,167, filed Jun. 10, 2005;
- U.S. patent application Ser. No. 11/069,512, filed Mar. 1, 2005;
- U.S. patent application Ser. No. 11/865,112, filed Oct. 1, 2007;
- U.S. patent application Ser. No. 10/987,288, filed Nov. 12, 2004;
- U.S. patent application Ser. No. 11/364,933, filed Mar. 1, 2006;
- U.S. patent application Ser. No. 11/127,326, filed May 12, 2005;
- U.S. patent application Ser. No. 11/128,5433, filed May 13, 2005; and
- U.S. patent application Ser. No. 11/190,436, filed Jul. 27, 2005.

BACKGROUND OF THE INVENTION

1. Field of the Invention

The present invention relates generally to the field of computational placement of elements, and more specifically to efficiently placing or locating photographs or graphic images on a page.

2. Description of the Related Art

Computer software is currently available for a user to collect and display graphical images in a visually pleasing format. Such computer software develops what have been called photo albums, comprising a series of pages having images selected by the user and arranged in various manners. A photo album page, as the term is used herein, refers to multiple graphical images or pictures positioned on a page of fixed size. Graphical images or pictures as used herein refer to a software depiction of virtually anything, including text, such that the graphical image or picture can be considered to have a rectangular boundary. Examples of graphical files include .gif, .tiff, and .jpeg graphical representations, but can include virtually any image having a boundary. For example, an oval shape block of text may be considered a graphical image or picture having rectangular borders touching the top, bottom, left, and right side of the oval shape block, including an optional border.

In deciding how and where to place graphical images on a photo album page, software must address various environment specific issues. For example, the number of pictures on the page, the size of the pictures relative to each other, spatial distribution of pictures, available empty space, and the existence of captions all factor into the placement of the selected graphical images on the photo album page.

In previous software systems for arranging graphical images, arrangement frequently occurred "by hand." In this process, the user opened a blank page document and imported digital graphical images. Software generated a "layout" on the photo album page by enabling the user to move images around the page, and possibly allowing resizing, so as to achieve a pleasing picture layout. The process of moving and resizing photos by hand can be tedious and time consuming. In response, developers have created automated software packages intended to at least partially automate the layout process.

Certain software packages automate the layout process by positioning images in rows and columns. By forcing images to fall into separate regions all of the same size and shape, layouts produced with this type of software package do not account for image aspect ratios, and graphical images may appear distorted when placed in the layout. This type of solution can lead to unused empty space on the page, which is visually unattractive and wastes available space.

Other software packages provide templates, where images are manually inserted into fixed template openings, or "holes." Templates can be attractive and can make efficient use of space, but available templates are often unusable due to the failure of aspect ratios for template holes to correlate with aspect ratios of images. While the image can be cropped to provide an acceptable appearance and aspect ratio within a particular template hole, cropping is generally unsatisfactory, as it requires discarding part of the image. Also, while the image can be reduced in order to appear complete and uncropped through the template hole, such size reduction can be unsatisfactory because the image appears smaller and is therefore more difficult to see. Some software packages allow the user to create new templates, but the template creation process is typically tantamount to manual layout, and hence tedious and time consuming.

Certain generally available software packages have specific layout design issues. Kodak Memory Albums ("KMA") exhibits tendencies that appear to automatically generate album page layouts without using templates. KMA does, however, leave empty space that could be occupied by simply enlarging a nearby image.

Canon PhotoRecord Gold ("CPG") is another software package that provides automatic photo album page layout. In one mode, CPG appears to employ a method for creating templates that accommodate the desired number of images. However, image sizes appear to be ignored in this mode, which can result in image overlap. The image overlap is irregular and often excessive and thus generally unattractive. Alternately, the CPG user can move one image on the page, while the software shifts the other images around the page to accommodate the image being moved. Control of image position shifting appears to be haphazard and in some cases results in images being completely obscured.

Another product called FotoFusion ("FF") from LumaPix generates single-page collages of photos. FF has an autocollage feature that takes a list of input images and generates a layout of all the images on a single page, and provides an ability to generate various alternative layouts. In the layouts generated by the autocollage feature, little or no white space exists between the photos, and the photos fit together like bricks in a wall. However, the photos in the layout are cropped, and parts of the photos discarded, which is undesirable.

None of the presently available software designs allows the user to specify relative image size for multiple images while simultaneously retaining the entirety of the images presented. Specification of relative image size can be desirable when, for example, the user wants one image to be significantly larger than all the others on the page. Further, no presently available software design completely eliminates empty, unused space within the rectangular region occupied by images on the page, while simultaneously retaining the entirety of the images presented. This rectangular region may be described as the "convex hull" staked out by the images.

Certain floorplanning or layout tree structures have been employed in different contexts. For example, others have used layout tree structures for VLSI circuit layout and for general document layout. In VLSI circuit layout, however, the circuits can be fixed in size, but do not typically have fixed aspect ratios. Circuits can thus be altered independently in x and y dimensions without regard to maintaining a ratio between x and y. Floorplanning solutions tend to materially differ from image placement designs due to the aspect ratio maintenance requirements frequently associated with image placement designs. In general document layout, as opposed to image layout, aspect ratios are also considered variable.

In certain circumstances, repeated determination of multiple potential layouts may afford a user a variety of possible attractive layouts from which to choose. However, certain users may wish to rapidly obtain an efficient layout, requiring minimal effort and relatively rapid processing.

It would therefore be desirable to offer a relatively rapid and efficient software solution to placing graphical images on a page with a minimal amount of empty space and a maximum variety of layout designs, while at the same time refraining from cropping the images received and minimizing drawbacks associated with previous graphical placement software.

SUMMARY OF THE INVENTION

According to a first aspect of the present design, there is provided a method for arranging a set of objects within an area. The method comprises (a) initiating a binary tree and associating a first object with the binary tree, (b) selecting a subsequent object not included in the binary tree, (c) establishing at least one candidate tree, wherein each candidate tree comprises objects from the binary tree and the subsequent object, (d) computing a score for each candidate tree and selecting one candidate tree having a highest score associated with placement of the subsequent object, (e), repeating (b), (c), and (d) until the candidate tree includes the set of objects, and (f) arranging the objects within the area in accordance with the candidate tree.

According to a second aspect of the present design, there is provided a method for arranging a set of objects within an area. The method comprises establishing a tree structure, associating a first object with the tree structure to form a candidate tree, modifying the candidate tree to form at least one alternate candidate tree by associating a subsequent object with at least one available location on the candidate tree, computing scores for each alternate candidate tree with the subsequent object in each available location, selecting the alternate candidate tree having a best score, and designating the selected alternate candidate tree to be the candidate tree, repeating said modifying, computing, selecting and designating for all remaining subsequent objects, and arranging the set of objects within the area in accordance with the candidate tree.

According to a third aspect of the present design, there is provided a method for arranging a set of objects within an area. The method comprises establishing a candidate tree having having at least one node, and at least one leaf connected to one node, and at least one object associated with the candidate tree, modifying the candidate tree to form at least one alternate candidate tree by associating a subsequent object with at least one available location on the candidate tree, computing scores for each alternate candidate tree with the subsequent object in each available location, selecting the alternate candidate tree having a best score, and designating the selected alternate candidate tree to be the candidate tree, repeating said modifying, computing, selecting and designating for all remaining subsequent objects, and arranging the set of objects within the area in accordance with the candidate tree.

These and other objects and advantages of all aspects of the present invention will become apparent to those skilled in the art after having read the following detailed disclosure of the preferred embodiments illustrated in the following drawings.

DESCRIPTION OF THE DRAWINGS

The present invention is illustrated by way of example, and not by way of limitation, in the figures of the accompanying drawings in which.

DETAILED DESCRIPTION OF THE INVENTION

The present design includes two functions, a full function that creates a variety of image layouts that may be selected by the user and that depend in large part upon user input, and a "single pass" function that is less computationally intensive than the full function but produces a visually attractive layout in a shorter period of time based on fewer inputs from the user.

With respect to the both the full function and single pass function, two specific modes of layout operation are considered, namely "strict area" layout and "brick" layout.

Figure 1:
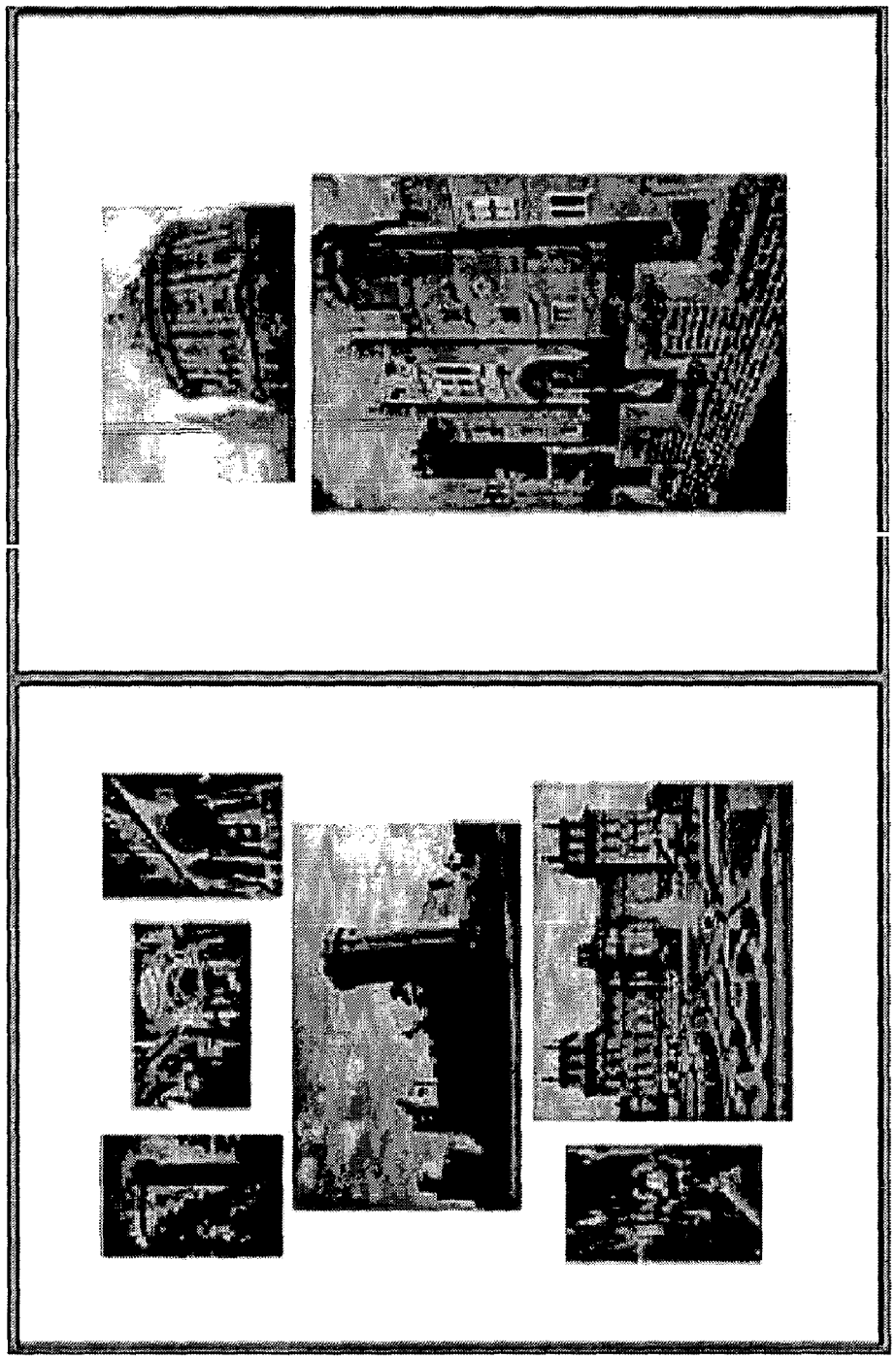
FIG. 1 illustrates the concept of strict area layout for a predefined space such as a printed page.

FIG. 1 illustrates the strict area layout mode of operation. Strict area generally refers to an image being located strictly within a particular area or subarea of the page. Conceptually, the page may be divided into multiple subareas, such as the left and right halves of the page, and the strict area layout mode may center one image in the right half of the page and another image in the left half of the page. When using the strict area mode of operation, the user may provide a relative area proportion value with each image, used for purposes of dividing the page into areas. Use of a relative area proportion value enables the user to specify one image being one-third the area of a second image on the same page and one-quarter the area of a third image, where areas are divided according to this preference and images centered in each area so divided. Relative area proportion is a numeric value, and in the foregoing example, if all three images are originally of the same area, the first relative area proportion will be 1.0, the second 3.0, and the third 4.0. Relative area proportion is independent of the concept of aspect ratio, a subject discussed later.

Mathematically, the strict area mode of operation indicates that on a given page, the areas of the images satisfy:

$$\frac{A_1}{e_1} = \frac{A_2}{e_2} = \Lambda = \frac{A_N}{e_N}$$

where N is the number of images on the page, $\{A_i\}$ are the actual image areas, and $\{e_i\}$ are the user specified relative image area proportions. Strict area layout controls relative image area proportions. If the user specifies that image A is to be three times the size of image B, the strict area layout mode directs image A to be three times the size of image B irrespective of the exact position or size of image A and image B on the page. Strict area layout may also be employed where the user specifies area constraints in a more casual way. For example, the user may specify that certain selected images should be larger than the other images on the same page (i.e., not larger by a precise multiplicative factor).

Figure 2:
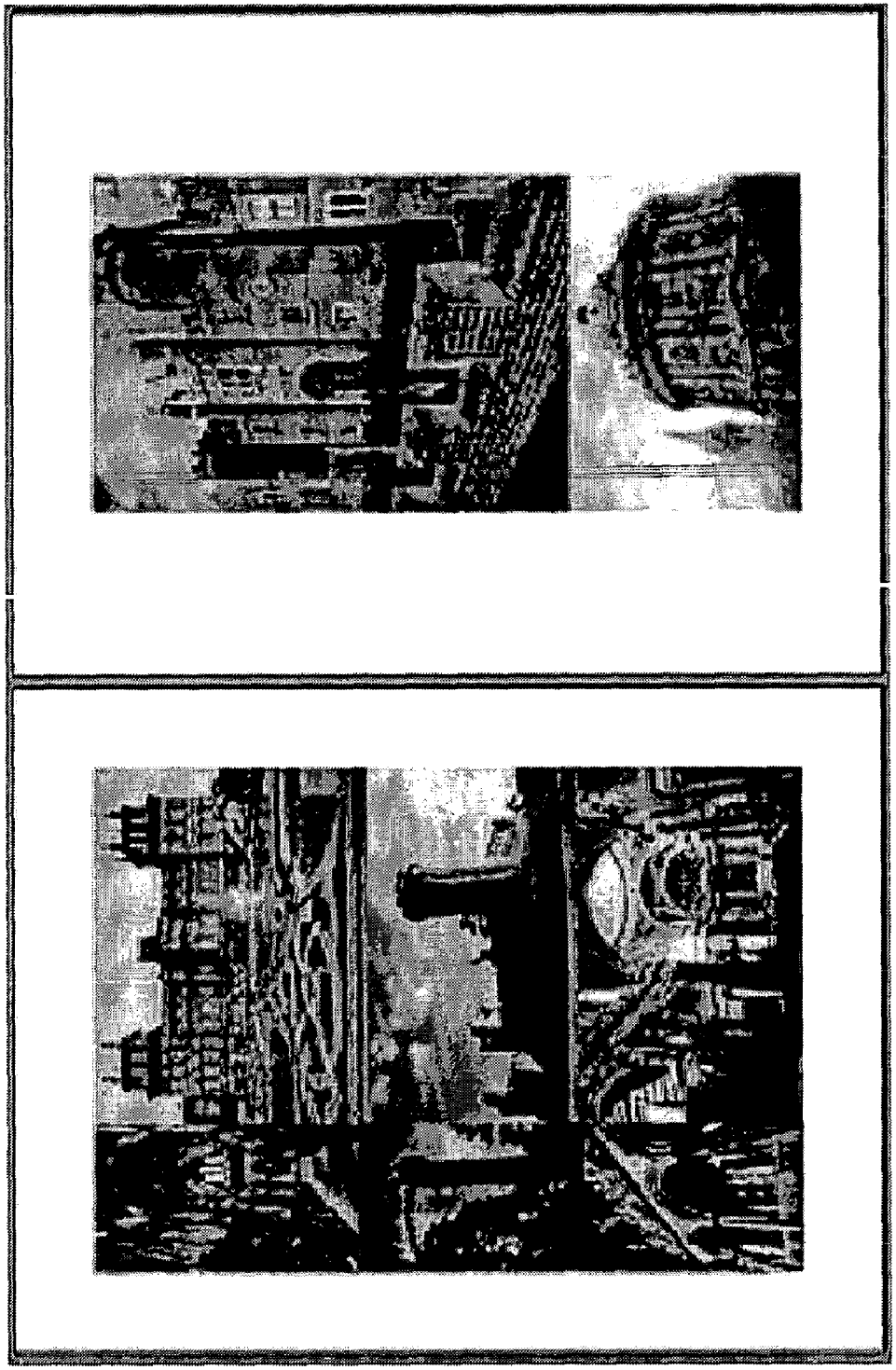
FIG. 2 shows brick style layout of objects or images.

FIG. 2 shows the alternate "brick layout" mode of operation. In FIG. 2, no white space exists between the images, which fit together like bricks in a wall. Brick style layout visually appears efficient, as no empty space exists within the "convex hull" staked out by the photos or images on the page.

While both the examples in FIGS. 1 and 2 show pages containing images only, the present design allows the user to also print a caption or insert a block under each image regardless of layout style. The user may also specify a "gutter width" of empty space to separate images in either layout style.

Figure 3:
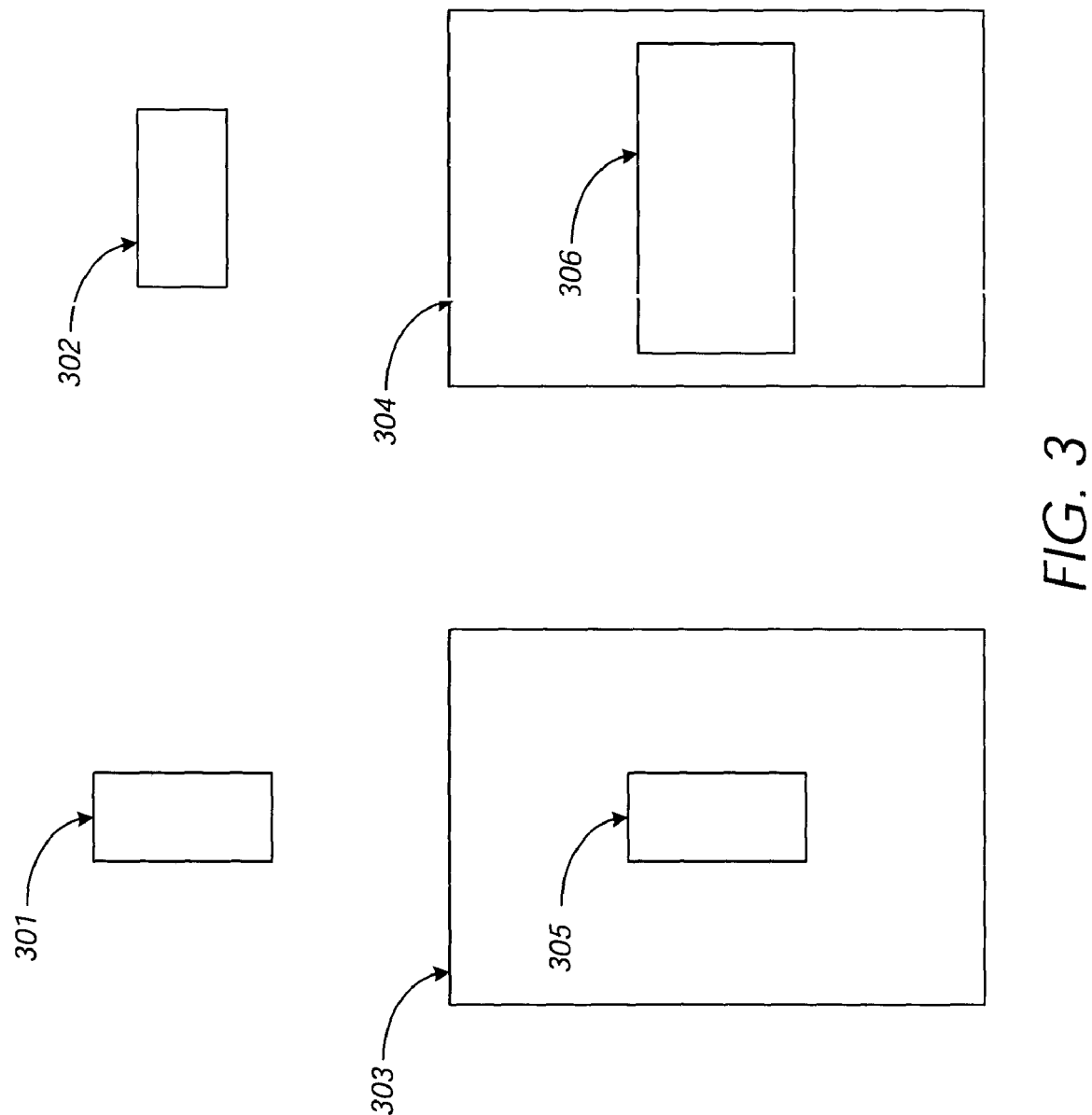
FIG. 3 illustrates the concepts of aspect ratio and relative area proportion.

FIG. 3 shows the concepts of aspect ratios, area, and relative area proportion for the present design. The aspect ratio is defined as the ratio of image height divided by image width. Box 301 has an aspect ratio of 2.0, while box 302 has an aspect ratio of 0.5 (one to two). The system seeks to maintain aspect ratios throughout operation. Each image occupies an area on the page. The "area" as used herein is an fixed attribute of a rendered image, which may measured for example in units of square inches. Assuming an 8.5 inch by 11.0 inch piece of paper, the page area is 93.5 square inches. A photo printed on that page with height 4.0 inches and width 6.0 inches has an area of 24.0 square inches. The "relative area proportion," as used herein, is an image attribute used to compare areas of two images on the same page. As such, "relative area proportion" and "area" are related but different concepts, with the former being purely relative in nature and the latter being absolute and measurable. Layout 303 shows a page with a first image 304 having relative area proportion 1.0 and a second image 305 having relative area proportion 4.0. Since the relative area proportions differ by a factor of 4, so do the measurable areas of the two images in rendered output (e.g., on a printed page, on a representation of physical space, or on a computer display), regardless of the particular numerical values of their measurable areas.

Figure 4:
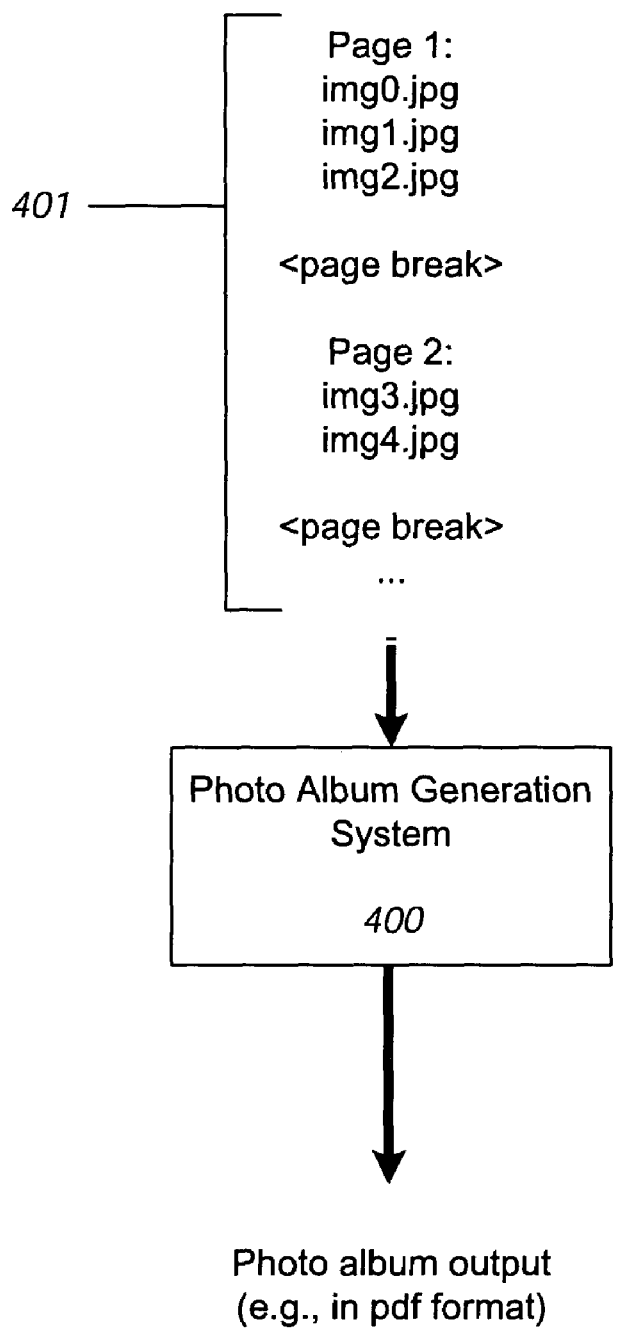
FIG. 4 is a broad general flowchart for an embodiment of the complete photo album creation system showing inputs and outputs.

FIG. 4 shows a flowchart for the complete photo album creation system 400. Input to the photo album creation system 400 is a listing 401 of the images to be included in the album, where the listing 401 here comprises img0.jpg, img1.jpg, and img2.jpg on Page 1, followed by img3.jpg and img4.jpg on Page 2. Other listings may be provided depending on user desires. Such a listing may indicate the position of each page break. Alternately, the design may use time stamps or other available computer information to determine page breaks. For example, if several images were captured within a few seconds of one another, followed by a pause, followed by more images, the page break may be located between the two groups distinctly separated in time. Output from the photo album creation system 400 is a photo album output, such as a collection of pages in, for example, pdf, jpg, or other available format, typically graphical in nature.

Generally, the focus of the present design is to progress from a relatively loose layout configuration where the system broadly assigns graphic images to leaf nodes in a tree structure to a precise layout configuration consistent with the mode of layout operation specified by the user.

Figure 5A:
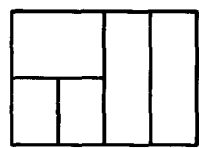
FIG. 5A shows a sequential division of a predefined area, such as a page, into subareas.
Figure 5A:
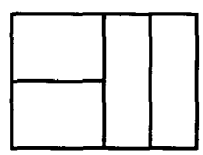
Figure 5A:
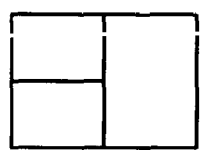
Figure 5A:
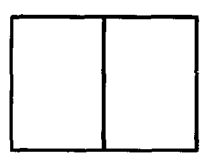
Figure 5A:
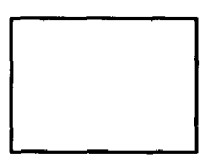
Figure 5B:
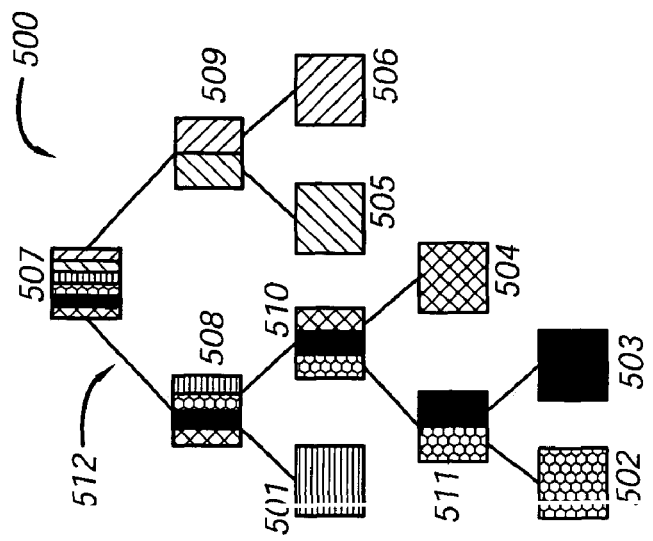
FIG. 5B is a divided predefined area and its corresponding binary tree structure.
Figure 5B:
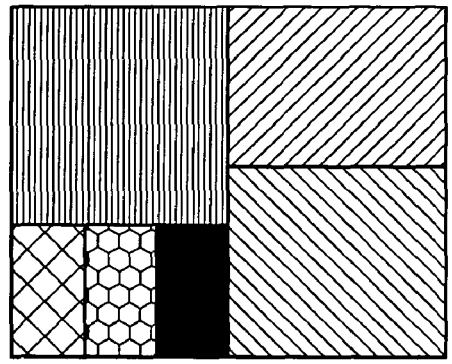

For purposes of defining the terms used herein, a "tree" is a structure such as that shown on the right side of FIG. 5B, where components of the tree correspond to features of the available page. The points in the tree that have branches emanating from them will be referred to as "nodes," while the point in the tree that do not have branches emanating from them are referred to as "leaves." The page may be divided sequentially such as in the manner shown in FIG. 5A. Each division corresponds to one node in the tree. The representation on the left of FIG. 5B shows a page divided into six subareas, representing five divisions made from the original page. The representation on the right of FIG. 5B is a tree having six end points, or leaves 501, 502, 503, 504, 505, and 506, and five nodes, 507, 508, 509, 510, and 511. A tree used in the present design, such as tree 500, therefore includes multiple leaves such as leaf 501, multiple branches such as branch 512, and multiple nodes such as node 507. The present design builds different tree structures depending on the desires of the user and the images presented, where each resultant tree structure forms a layout, and multiple tree structures and layouts may be prepared.

Figure 6:
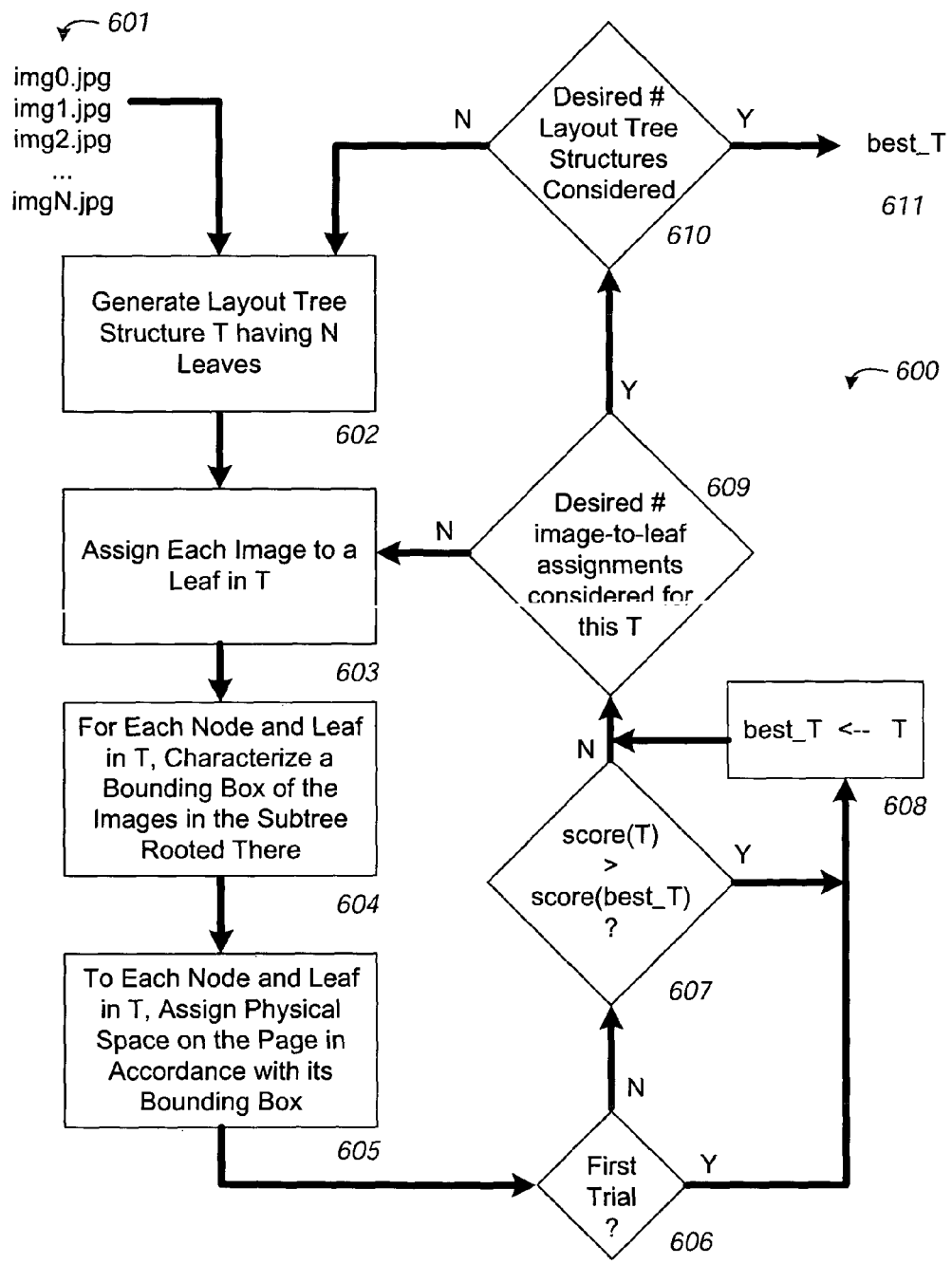
FIG. 6 illustrates a detailed flowchart of an embodiment of the complete photo album creation system.

FIG. 6 shows a detailed flowchart of the present design. The input to the design is a list of the images 601 that are intended by the user to appear on the page, and the output 611 is a layout specification, best_T, indicating a position and size for each image in the list of images 601. The basic operation entails the system generating a number of candidate layouts, along with a score for each candidate layout, and then outputting a candidate layout having the highest score via the output 611.

The preferred mode of operation is for the output best_T to provide one best layout having the highest score among all the candidate layouts. However, in a scenario where the user desires to examine multiple alternative layouts, the output best_T may represent a plurality of layouts. For example, five layout tree structures may be desired so that the user can choose among the five. In the multiple alternative layout scenario, best_T could represent a number of candidate layouts selected as having higher layout scores than any other layout computed.

Element 602 generates a layout tree structure T having N leaf nodes, while element 603 takes the tree structure so generated and assigns each image to a leaf in T. The system may assign leaves, branches, and nodes randomly, and may recall earlier trees attempted if the user ultimately decides to employ a different design and thus desires to revisit a previous tree. Element 603 may randomly assign images to leaves in the tree so created, which may also be done randomly and the choice retained if an alternate layout is desired. Taking FIG. 5B as an example, six images may be received, and a five node—six leaf tree employed. Alternately, the two bottom leaves, namely leaves 502 and 503, could be located below leaf 501, 504, 505, or 506, making those leaves nodes, and node 511 into a leaf.

Element 602 may be implemented in different ways to generate a layout tree structure. The input required to element 602 is the number N of images. One way to generate the layout tree structure entails generating a binary tree structure with N leaves and (N−1) nodes, and subsequently assigning a cut direction to each node. Both the shape of the tree structure (i.e., the network of nodes and leaves), and the cut directions assigned to the nodes may be random. In the present aspect of the design, the system generates the tree structure deterministically while the cut directions are assigned randomly, effectively flipping a coin and assigning HORIZ (horizontal cut) in case of heads and VERTIC (vertical cut) in case of tails. The present implementation for element 603 is to generate a random one-to-one mapping between the images and the leaves of the tree. Elements 602 and 603 thus provide the general framework for candidate layouts.

Element 604 then characterizes a bounding box for the images in the subtree for each node in tree structure T. As used herein, the "subtree" of a node is defined as the node itself, taken along with all the branches, nodes and leaves that emanate from the node in the direction of the leaves, or emanate in a generally downward direction for the trees illustrated in the drawings herein. A bounding box is an area of space that bounds the image, as well as any associated caption or other material. In element 605, the system assigns physical space on the page in accordance with the bounding box of each node in T. The result from element 605 is a candidate layout specified consistently with the selected mode of layout operation, or desired layout style (e.g., strict area layout or brick layout). Elements 604 and 605 are described in more detail below.

Decision 606 determines whether the candidate layout is the first candidate layout formed, and if so, element 608 moves T into a Best Tree (best_T) register or storage location. If the result of decision 606 is that the candidate layout was not the first candidate layout formed, decision 607 computes a score for T and a score for best T. If the score of T is greater than the score of best_T, step 608 moves T to the best_T position or register, and control then moves to decision 609. On the other hand if the result of decision 607 is that the score of T is not greater than the score of best_T, control then moves to decision 609.

The score may be computed in different ways. One way to compute a score is to assess the empty space on the page and the layout with the least blank space is the best layout. This scoring may be used for strict area layouts, since relative area proportions are already fixed in the case of strict area layout. Another way to compute the score is to seek the most uniform images on the page, accomplished by determining the ratio of the smallest image area on the page divided by the greatest image area on the page, and choose the greatest result. For scoring brick style layouts, scoring may be performed by determining a combination of empty space and image area uniformity so that neither criterion suffers excessively at the expense of optimizing the other.

Decision 609 determines whether the desired number of image-to-leaf assignments have been considered for the particular tree structure T. This desired number maybe determined by the user or other controlling entity, such as a remote automated program. In general, designating a greater number of image-to-leaf assignments increases the chance of finding a better layout. Desired number is highly dependent on the number of images desired for the specific page. If the number of images is low (e.g., two or three images), the desired number may be set low. If the number of images is great, the desired number may be high, e.g., 100 or more. With respect to the flowchart, if the result of decision 609 is negative, control passes back to element 603, where the system generates a new image-to-leaf assignment, resulting in a new layout configuration. If the result of decision 609 is positive, control passes to decision 610.

At decision 610, the system determines whether the desired number of layout tree structures have been considered, where desired number may be determined by the user or other controlling entity. The layout tree structure significantly effects the resulting layout. Therefore, a greater number of layout tree structures increases the chance of the user finding a better layout. If the result of decision 610 is positive, best_T results at output 611. If negative, the system repeats element 602 by generating a new layout tree structure T having N leaf nodes.

In element 604, for each node and leaf in the layout tree structure, the system characterizes a bounding box enclosing images in the subtree rooted there. The system computes an aspect ratio, denoted "a," and a relative area proportion, denoted "e." From these parameters, the system characterizes or defines a bounding box. For example, an aspect ratio of 4:3 may be characterized as an "a" of 1.3333, and the relative area proportion may be 1.0 for a first image and, for example, 2.5 for a second image, indicating the second image is desired to be 2.5 times as large as the first image. An "a" of 1.3333 and an "e" of 2.5 thus defines a bounding box that may be manipulated and positioned.

Characterization of a bounding box for any node requires a priori characterization of the bounding boxes for its two children, as will be discussed. Due to this a priori bounding box characterization requirement, element 604 in FIG. 6 operates to, in a sense, work "up" the tree, from a lowest leaf node up through nodes to the top, or root, of the tree.

For leaves, the bounding box characterization of element 604 is straightforward, in that the aspect ratio is equal to the aspect ratio of the photo assigned to the leaf. For strict area style layout, the user may provide the relative area proportion. Alternatively, the system may determine relative area proportions for the leaves in a random or dynamic fashion. For brick style layout, the initial numerical values of the relative area proportions are immaterial and the user or system may assign any positive value.

Figure 7:
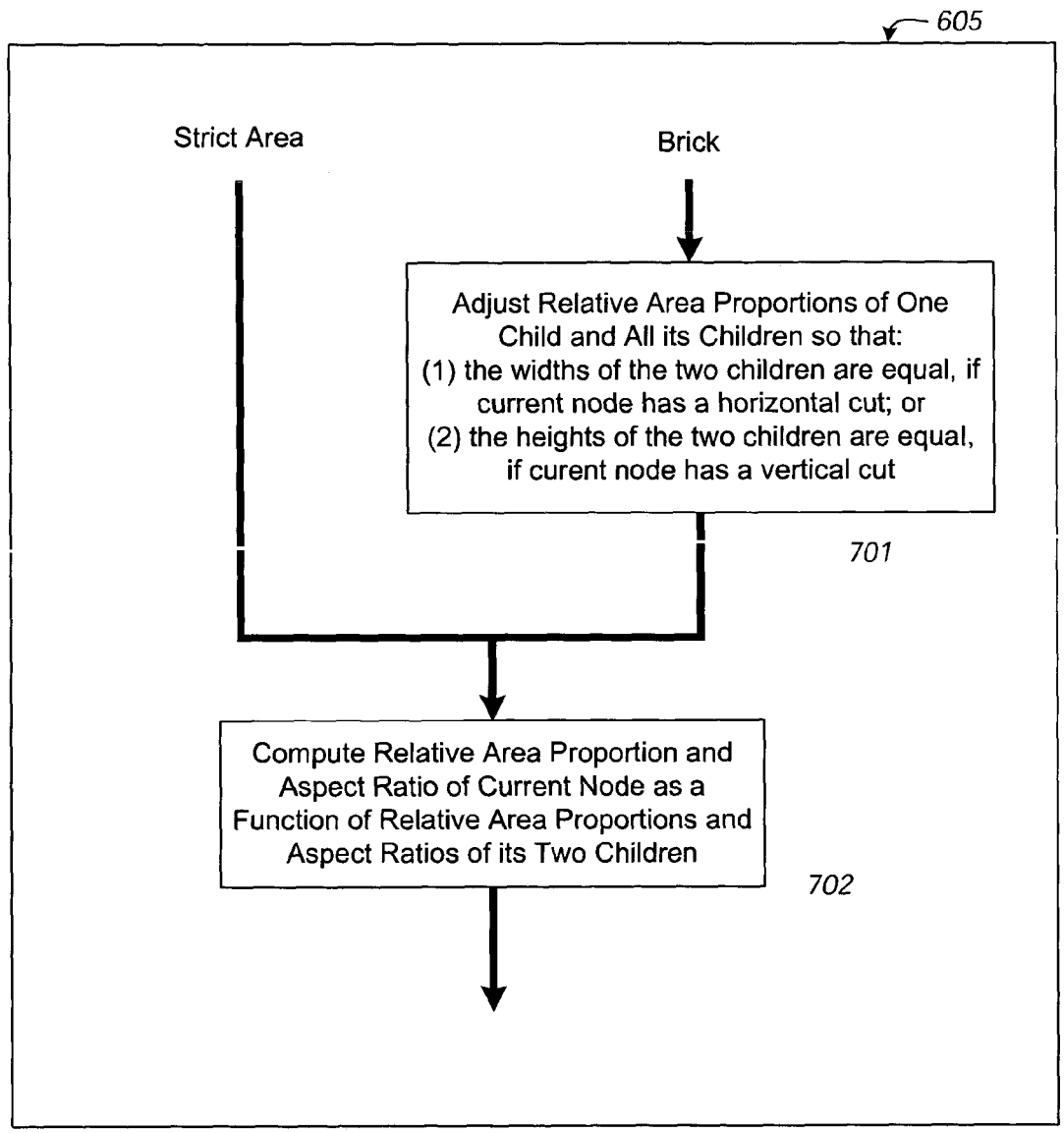
FIG. 7 is a flowchart illustrating forming a bounding box and is equivalent to element 604 of FIG. 6.

For nodes, the system forms a bounding box according to the flowchart in FIG. 7. Input is either a strict area style indication or a brick style indication, typically specified by the user. For block 701, executed when the system provides a brick style indication, the system adjusts the relative area proportions of one child of the node and all its children depending on the type of cut desired. If the current node has a horizontal cut, adjustment is made so that the widths of the bounding boxes of the two children are equal. If the current node has a vertical cut, adjustment is made so that the heights of the bounding boxes of the two children are equal. At block 702, performed for both strict area style and brick style, the system computes relative area proportion and aspect ratio for the current node as a function of relative area proportions and aspect ratios of its two children.

In operation, if the current node provides a vertical cut, block 701 adjusts the right child so that the rectangle containing the images in the subtree of the right child will have the same height as the rectangle containing the images in the subtree of the left child. Similarly, if the current node provides a horizontal cut, block 701 adjusts the right child to have the same width as the left child.

The decision to adjust the right child in operation, as opposed to adjusting the left child, is neutral, or a "don't care." That is, alternately, block 701 could adjust the left child and all of its children to have the same height or width as the right child. Either method may be implemented, as the system is setting relative area proportions which may be altered at this point.

Specifically, in block 701, the system multiplies the relative area proportions of the right child and all its children by the following factor:

$$\text{factor} = \begin{cases} (e_l \cdot a_l) \div (a_r \cdot e_r), & \text{if cut direction is vertical} \\ (e_l \cdot a_r) \div (a_l \cdot e_r), & \text{if cut direction is horizontal} \end{cases}$$

where $e_l$ and $a_l$ are the relative area proportion and the aspect ratio, respectively, of the left child of the current node, and $e_r$ and $a_r$ are the relative area proportion and the aspect ratio, respectively, of the right child.

Figure 8:
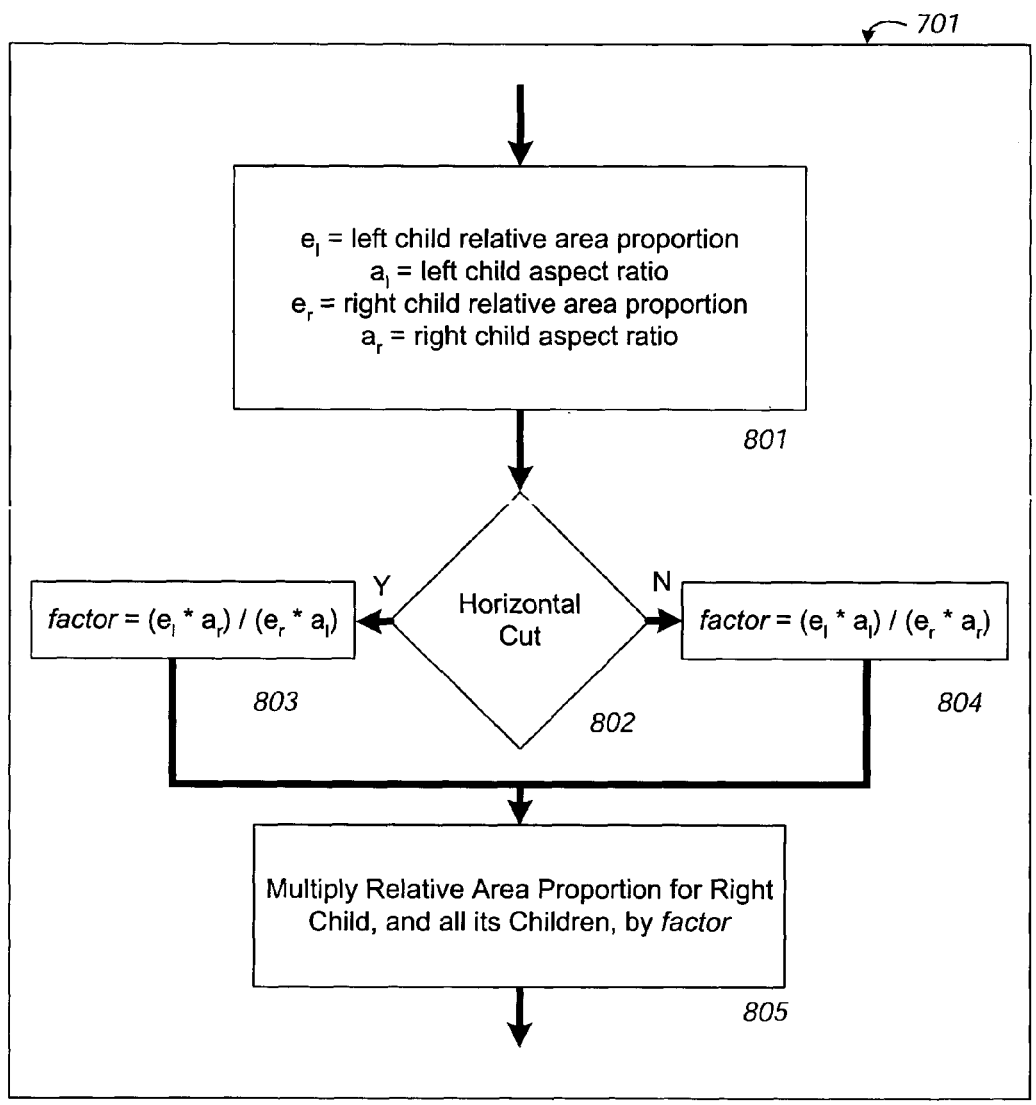
FIG. 8 illustrates a flowchart representing block 701 of FIG. 7.
Figure 9:
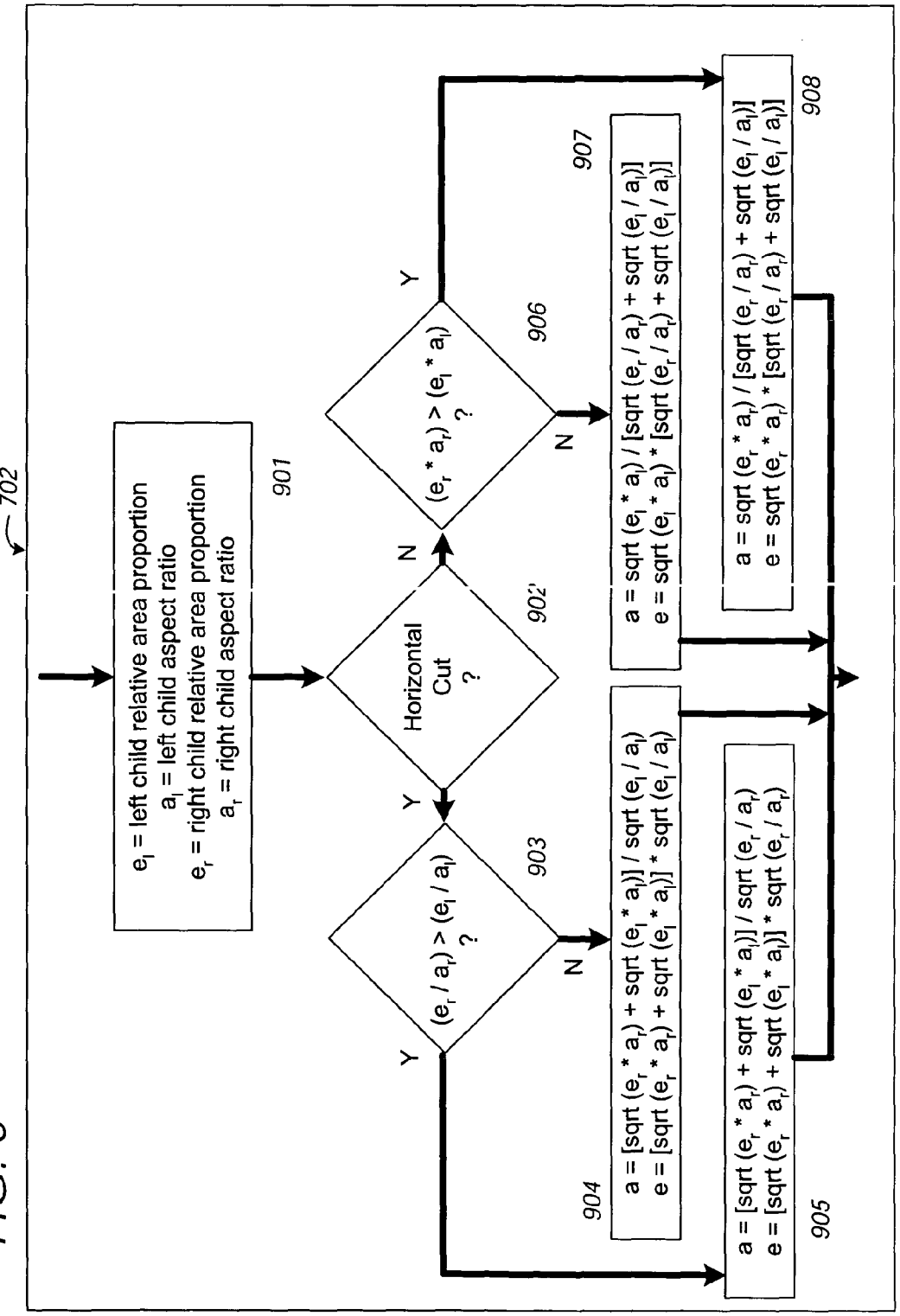
FIG. 9 is a flowchart of block 702 of FIG. 7.

FIG. 8 illustrates a flowchart representing block 701 of FIG. 7, while FIG. 9 is a flowchart of block 702 of FIG. 7. From FIG. 8, element 801 obtains left and right children relative area proportions and aspect ratios. Depending on whether a horizontal cut, in this example, is desired at decision 802, the system computes factor according to element 803 or 804. With factor computed, the system at element 805 multiplies relative area proportion for the right child and all its children by the factor so computed. From FIG. 9, again element 901 obtains left and right children relative area proportions and aspect ratios. Again, in this example the system makes a decision 902 as to whether this is a horizontal cut (the decision may alternately be whether this is a vertical cut). If the present cut is horizontal, the system determines in decision 903 whether right child relative area proportion divided by right child aspect ratio exceeds left child relative area proportion divided by left child aspect ratio. If so, aspect ratio and relative area proportion for the current node are as computed in element 905. Otherwise, they are as computed in element 904. If the present cut is not horizontal, the system determines in decision 906 whether right child relative area proportion multiplied by right child aspect ratio exceeds left child relative area proportion multiplied by left child aspect ratio. If so, aspect ratio and relative area proportion for the current node are as computed in element 908. Otherwise, they are as computed in element 907. The result is thus an aspect ratio and relative area proportion for the current node.

A simple example follows. In the case of strict area style layout, the user may have specified for two images A and B an $e_l$ of 1.0 and an $a_l$ of 4.0 for image A and an $e_r$ of 2.0 and an $a_r$ of 2.0 for image B. Thus for the node having image A and image B as its children, from FIG. 9, with a horizontal cut desired, decision 903 computes whether 2.0/2.0 is greater than 1.0/4.0, and 1.0 is greater than 0.25. Thus a is equal to (2.0+2.0)/1.0, or 4.0, and e is equal to (2.0+2.0)*1.0, or 4.0. Thus the node containing images A and B has a bounding box defined by an aspect ratio of 4.0 and a relative area proportion of 4.0.

Thus, from element 605, the system allocates a rectangular region of space on the page for the images associated with each node in the layout tree structure contained in the subtree rooted at the node. A rectangular region of space refers not only the height and width of the region, but also the region's absolute position relative to the borders of the page. In allocating space for any node that is not the root node, the system takes into consideration that it already allocated space for that node's parent. Conceptually, element 605 thus operates by working from "top to bottom" of the tree structure, starting at the root node and finishing at the leaf nodes. The regions of space allocated in step 605 are different than the bounding boxes determined in step 604. The main difference is that regions of space reflect actual physical area in rendered output pages, which is measurable in distance units such as square inches or square millimeters; while bounding boxes are expressed using relative notions of area occupied.

In operation, element 605 causes the system to first assign the region of space of the entire page to the root node. This "entire page" may represent a complete face of a physical page, or only the useable portion of a physical page. For example, the entire page may not include space previously dedicated for margins, headers and footers. The system therefore assigns the height and width of the region of space to the root node, and further assigns spatial location coordinates indicating the left and bottom position of the region of space. Other spatial location coordinates could be used, such as the center of the region of space, or the top right-hand corner of the region of space. The region of space may further be assigned to a conceptual representation of a region.

With the height and width of the region of space assigned, the system then computes the aspect ratio and the area of the region of space. Generally, the aspect ratio of the bounding box of the root node as determined in element 604 may not equal the aspect ratio of the page.

Figure 15A:
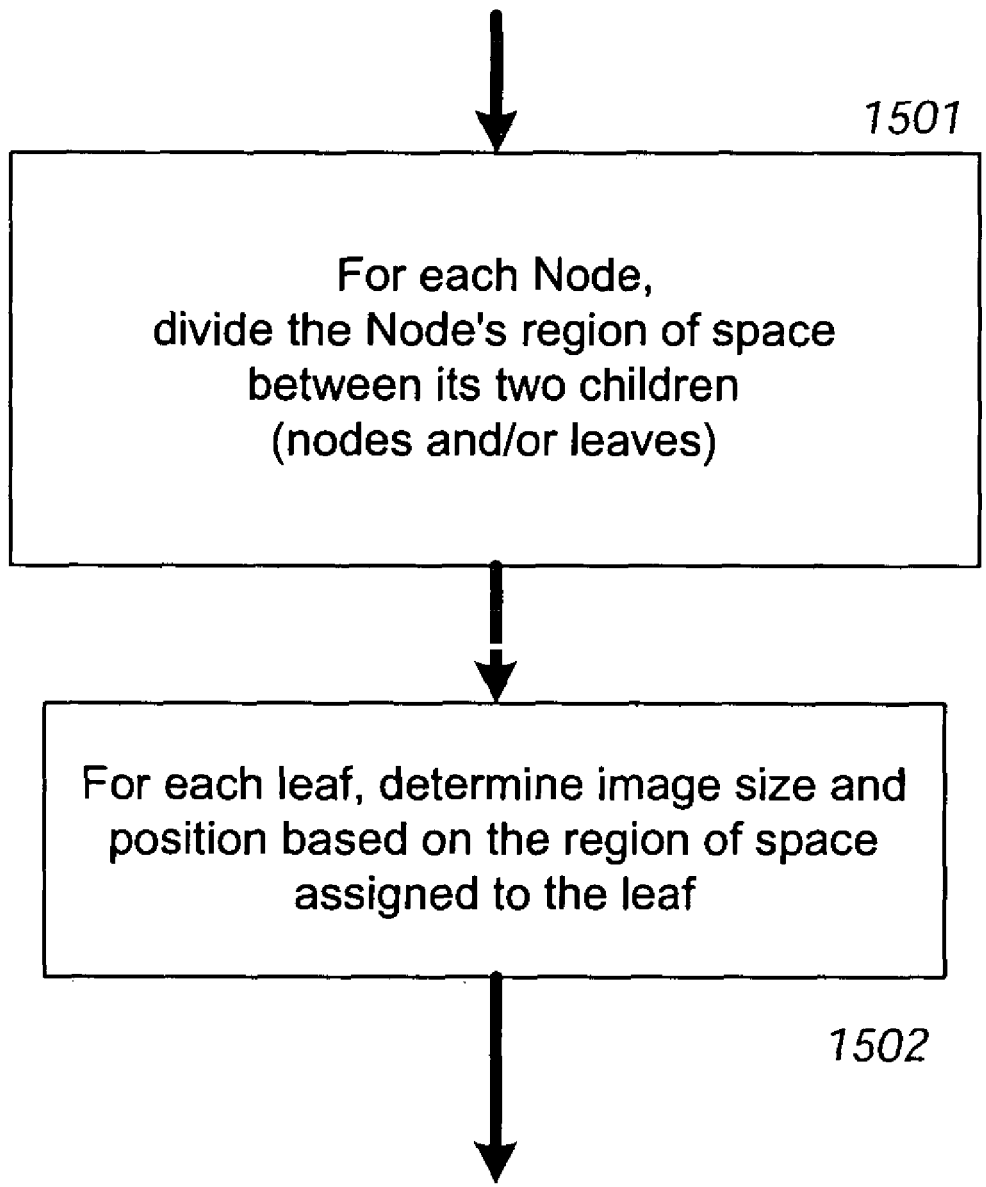
FIG. 15A represents operation of element 605 of FIG. 6.
Figure 15B:
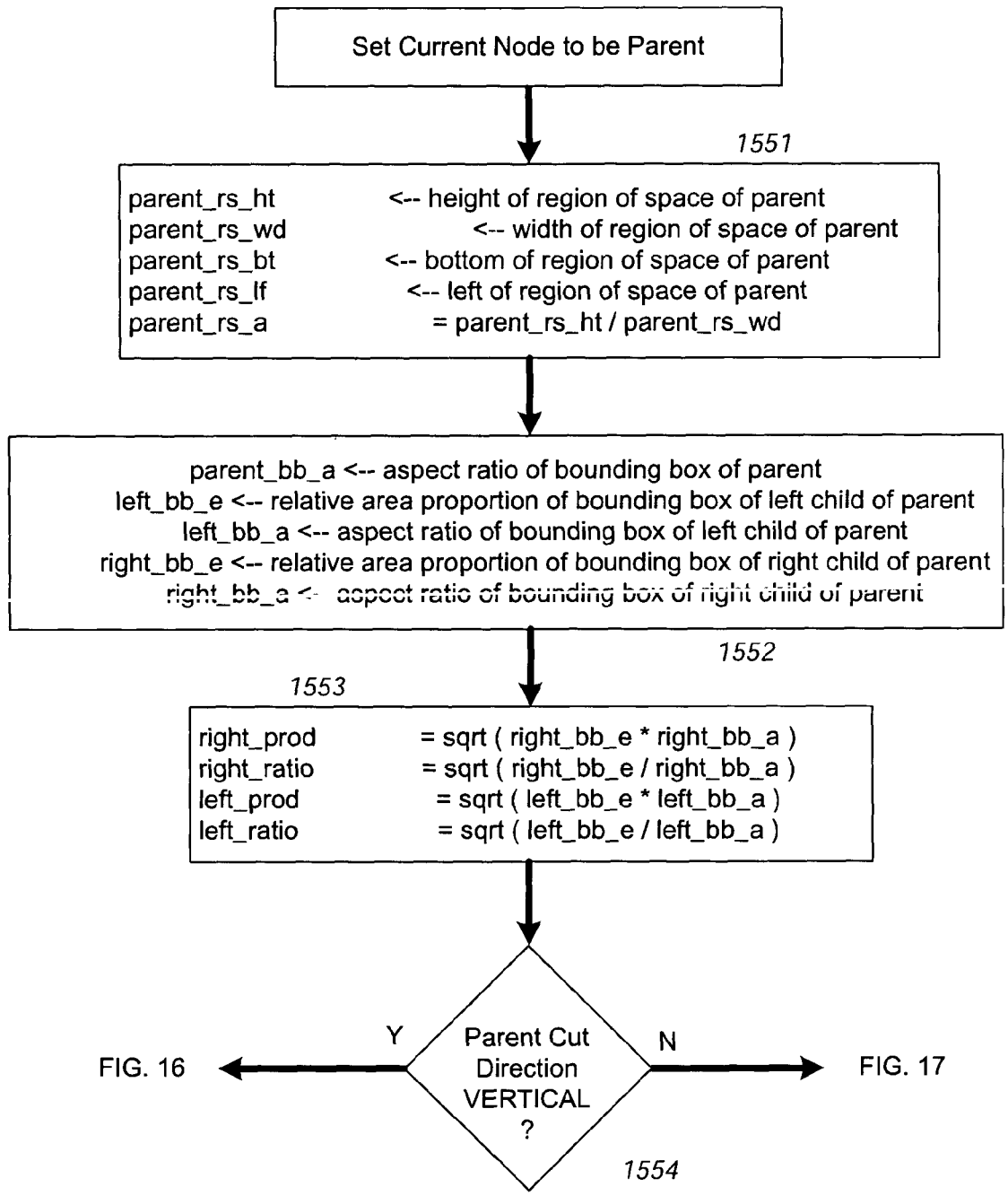
FIG. 15B illustrates the variables employed and the preloading of values available for use in performing element 605, as represented by FIGS. 15A, 16, and 17.

Subsequently, the system steps through the nodes and eventually the leaves. At a node, the system takes the space allocated to the node, divides the space into non-overlapping subsets, and then assigns the subsets to the children of the node. Ways of dividing and assigning may vary depending upon the desired layout style. Element 605 operates as shown in FIG. 15A, whether brick style or strict area style is employed. From FIG. 15A, element 1501 indicates that for each node, the system divides the region of space between its two children, be they children nodes or leaves. Element 1502 states that for each leaf, the system determines the image size and position based on the region of space assigned to the leaf. FIG. 15B illustrates the variables used in element 605, including the loading of variables performed in element 605. The system initially sets the current node to be the parent. From element 1551, the system defines and loads certain parent "region of space" variables. These variables are filled if the root node is the node evaluated, or these values may have been computed previously if the node evaluated is not the root node. parent_rs_ht represents the height of the parent region of space, and parent_rs_wd the width of the parent region of space. The bottom and left of the parent region of space are also designated, but other measures may be employed, such as top and/or right of the parent region of space. The system computes the parent region of space aspect ratio parent_rs_a, representing the parent region of space height divided by the parent region of space width. From element 604, the system in element 1552 loads the relative area proportion of the bounding box of the left child of the parent into left_bb_e, the aspect ratio of the bounding box of the left child of the parent left_bb_a, and the right child counterparts of these values. The system in element 1552 also loads the aspect ratio of the bounding box of the parent into parent_bb_a. Finally, element 1553 computes right child and left child products and ratios. In decision 1554, the system determines whether a vertical or horizontal cut is desired. If a vertical cut, the system progresses to the flowchart of FIG. 16, while a horizontal cut causes the system to progress to the flowchart of FIG. 17.

Figure 16:
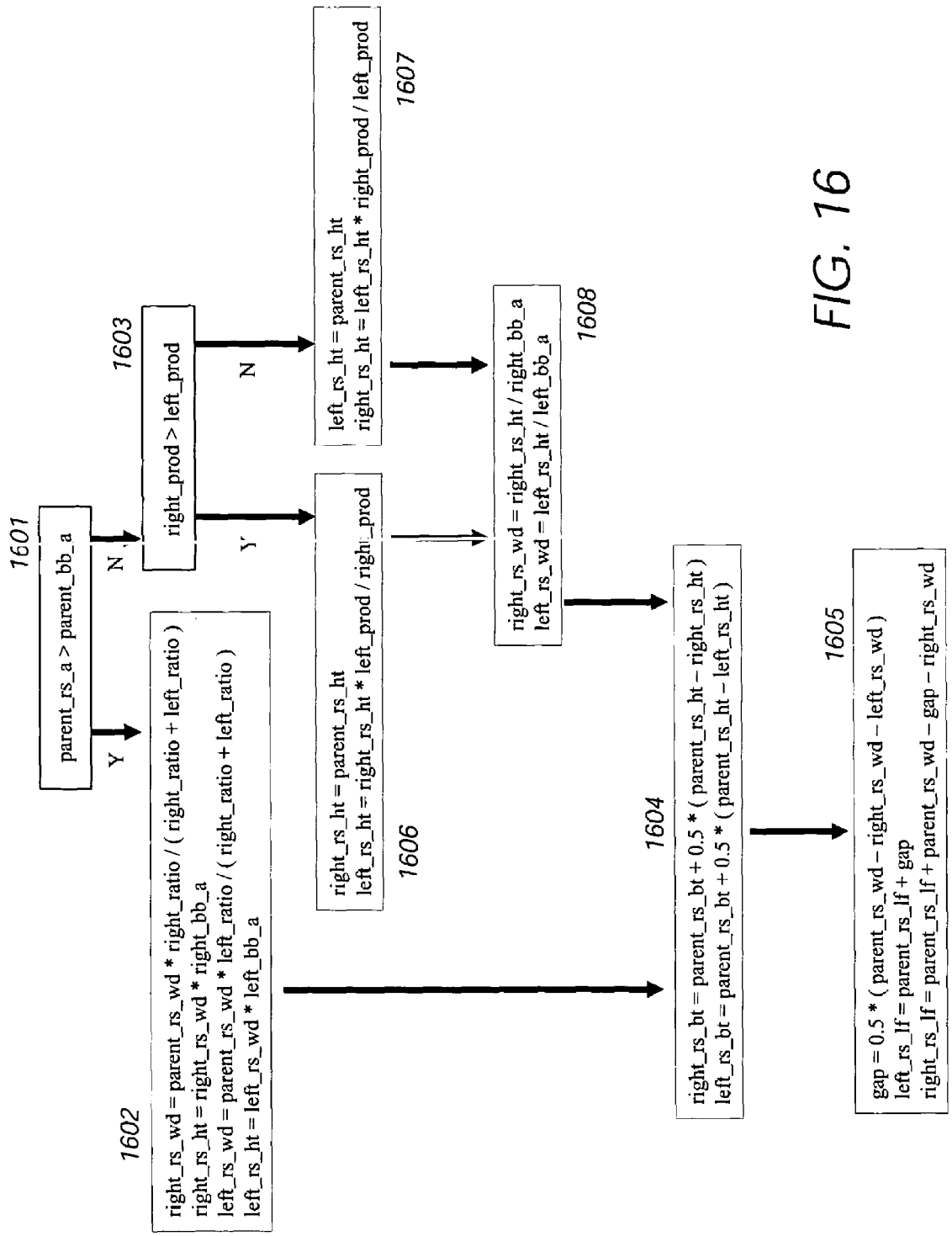
FIG. 16 shows operation of element 605 if the desired parent cut direction is vertical.

From FIG. 16, decision 1601 determines whether the parent region of space ratio parent_rs_a is greater than the aspect ratio of the bounding box of the parent, parent_bb_a. If so, operation progresses to element 1602, which computes widths and heights of right and left regions of space as shown. From element 1602, operation passes to element 1604, computes bottom positions for the left and right children regions of space, right_rs_bt and left_rs_bt. Operation progresses to element 1605, which computes a gap between the left and right children, and the left positions of the left and right children, left_rs_lf and right_rs_lf.

If the parent region of space ratio parent rs_a is not greater than the aspect ratio of the bounding box of the parent as determined in decision 1601, the system determines in decision 1603 whether the right child producer as computed in element 1553 exceeds the left child product computed in element 1553. If the right child product, right_prod, exceeds the left child product, left_prod, operation proceeds to element 1606, which computes right and left child region of space heights, right_rs_ht and left_rs_ht. If decision 1603 determines that the right child product as computed in element 1553 is not greater than the left child product computed in element 1553, the system computes right and left child region of space height, right_rs_ht and left_rs_ht, in element 1607. Element 1607 thus computes the same variables using different computations than shown in element 1606. From element 1606 or element 1607, operation progresses to element 1608, which computes left and right child region of space widths, left_rs_wd and right_rs_wd. Operation then progresses to elements 1604 and 1605 as shown to compute gap size and positions of the left and right children on the page.

Figure 17:
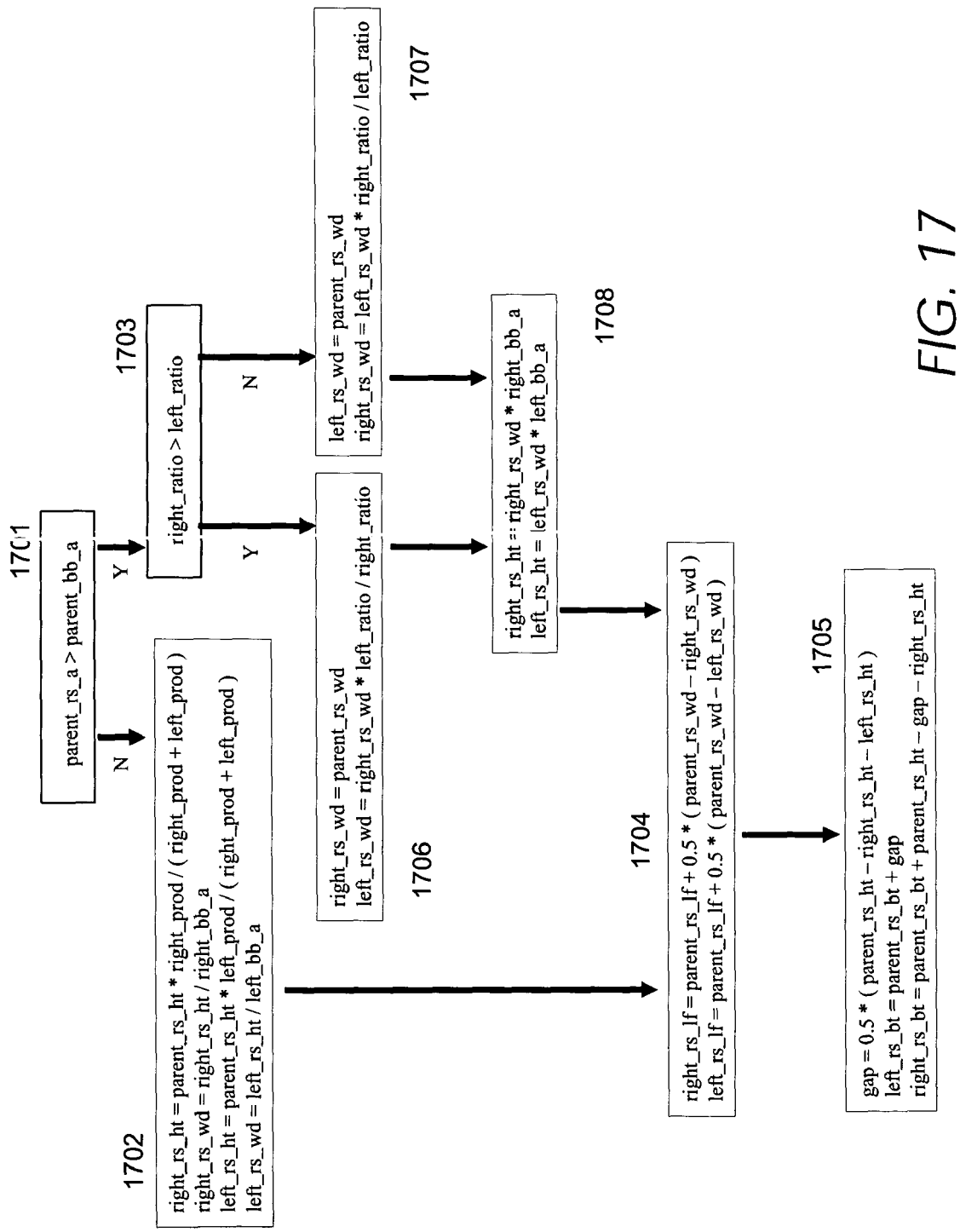
FIG. 17 is a flowchart of element 605 operation if the desired parent cut is horizontal.

In the event the parent cut direction is horizontal in decision 1504, operation progresses to FIG. 17 and specifically decision 1701. Decision 1701 determines whether the parent region of space ratio parent_rs_a is greater than the aspect ratio of the bounding box of the parent, parent_bb_a. If not, operation progresses to element 1702, which computes widths and heights of right and left regions of space as shown. From element 1702, operation passes to element 1704, computes left side positions for the left and right children regions of space, right_rs_lf and left_rs_lf. Operation progresses to element 1705, which computes a gap between the left and right children, and the bottom positions of the left and right children, left_rs_bt and right_rs_bt.

If the parent region of space ratio parent_rs_a is greater than the aspect ratio of the bounding box of the parent as determined in decision 1701, the system determines in decision 1703 whether the right child ratio as computed in element 1553 exceeds the left child ratio computed in element 1553. If the right child ratio, right_ratio, exceeds the left child ratio, left_ratio, operation proceeds to element 1706, which computes right and left child region of space width, right_rs_wd and left_rs_wd. If decision 1703 determines that the right child product as computed in element 1553 is not greater than the left child product computed in element 1553, the system computes right and left child region of space width, right_rs_wd and left_rs_wd, in element 1707. Element 1707 thus computes the same variables using different computations than shown in element 1706. From element 1706 or element 1707, operation progresses to element 1708, which computes left and right child region of space heights, left_rs_ht and right_rs_ht. Operation then progresses to elements 1704 and 1705 to compute left and bottom positions for the left and right children as well as the gap between children.

Different ways of performing this computation and determination as element 605 may be employed while still within the scope of the present design. The system thus proceeds through leaf nodes, and determines a position and size for the image assigned to each leaf node. The system allocates a region of space to all leaf nodes having an aspect ratio equal to that of the image assigned to a particular leaf node. The system may position the image to be as large as possible within the available region of space. Alternatively, the system may position the image to be smaller than this largest possible size for the purpose of providing space between the images, thereby improving layout appearance in certain circumstances. As an example of this alternative, the system may designate each image to have height and width equal to 0.95 of the largest possible height and width allowable within the available region of space. (Still other methods could be used to locate white space between neighboring images.) This generally concludes operation of element 605.

Finally, returning to FIG. 6, any of a number of scoring functions may be appropriate for element 607. In strict area layout mode, where image relative area proportions are fixed, the system may use the fraction of the page occupied by the image(s). Scoring in this manner enables images to be as large as possible while simultaneously respecting the user specified relative area proportions. In brick layout mode, the user does not set the relative image area proportions, but rather relative image area proportions are dictated by the general configuration, such as the layout tree structure and the assignment of images to particular leaf nodes. In this case, the system may employ a more complex scoring function that encourages the images to be large and of relatively consistent area. Scoring may thus vary depending on desired performance and circumstances.

Single Pass Operation

In order to speed up the layout process, the foregoing arrangement and design may be modified to assemble a layout based on user input in a single pass, without the processing required from the flowchart of FIG. 6 from the foregoing description.

While the present design could be used to generate layouts in any style, including the strict area style, brick style layouts may be advantageously employed in the present single pass design.

Figure 10:
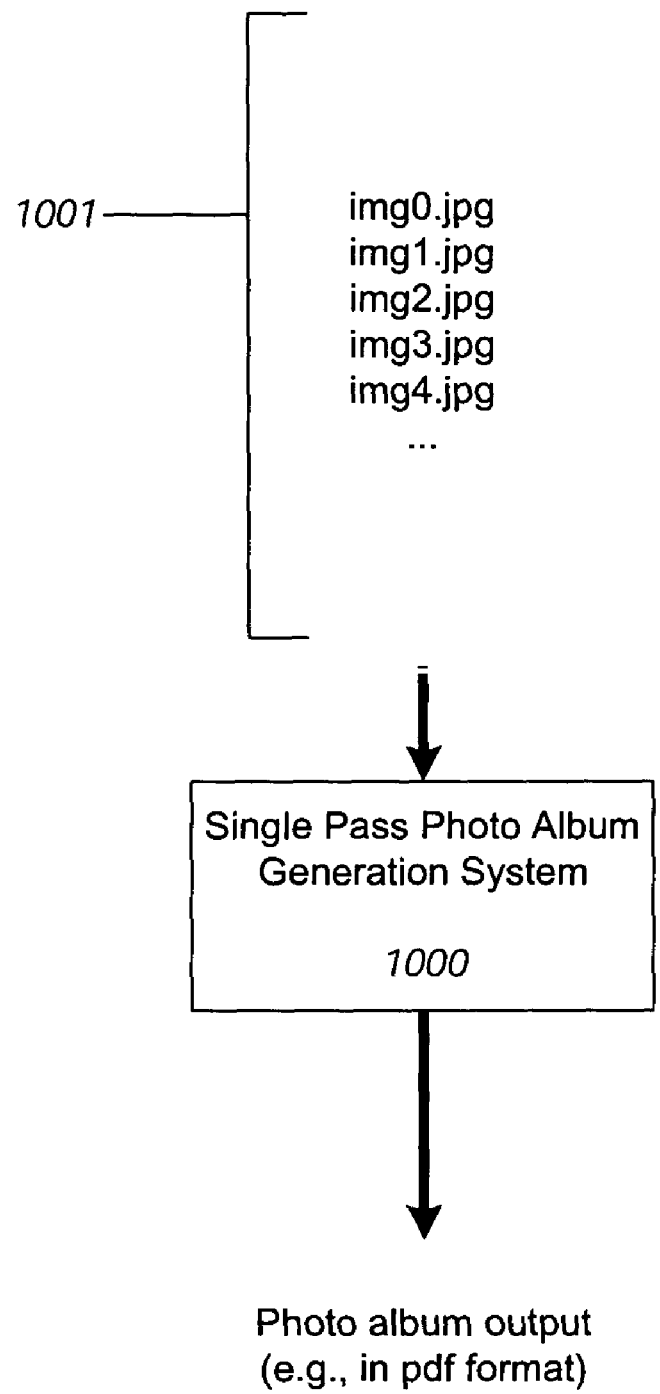
FIG. 10 illustrates a broad conceptual flowchart of an embodiment of a photo album creation system according to the single pass design, including inputs and outputs thereof.

FIG. 10 shows a photo album creation system according to the present single pass design. According to FIG. 10, the user supplies a set of images, rather than the set of images, layout style, proportions, and so forth. As with the foregoing description, the system could take images from various sources, including a folder on the user's computer, a digital camera memory card, an online photo sharing website, or other similar image source.

The user further specifies the location of page breaks. However, it is unnecessary for the user to explicitly specify page breaks. For example, the user may specify that each page should have no more than five images. Alternately, the system may provide a maximum number of images per page, such as four, or may randomly or semi-randomly set page breaks, such as setting a random number between three and seven images per page. Other page break provisions may be provided.

FIG. 11 shows the single pass automatic layout design. The system takes the images 1001 specified and adds each image to the layout one at a time. The system writes the layout in the form of a binary tree structure such as the binary tree structure illustrated in the right half of FIG. 5B. The system adds each image to the layout by inserting the image into the layout tree structure. The system may insert the image at any of multiple locations within a layout tree structure. The present design places the image in all available tree structure locations and selects the location yielding a layout having a highest score. Selection of the highest score layout location is represented in elements 1110 and 1114 of FIG. 11. The result of the single pass photo album generation system 1000 is a photo album output in a particular format, such as pdf.

Figure 11A:
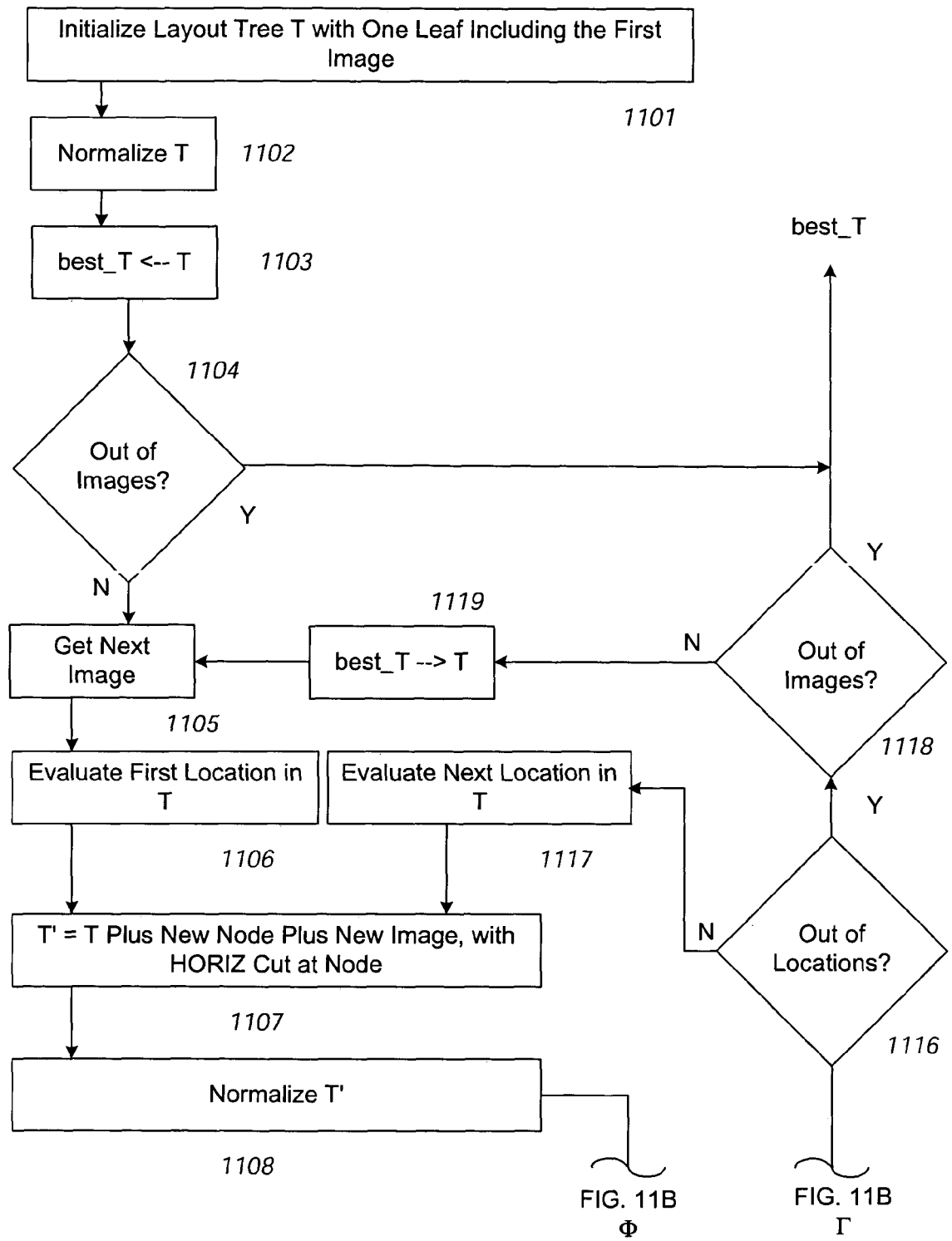
FIG. 11A is the first part of a detailed flowchart of an embodiment of a photo album creation system according to the single pass design.
Figure 11B:
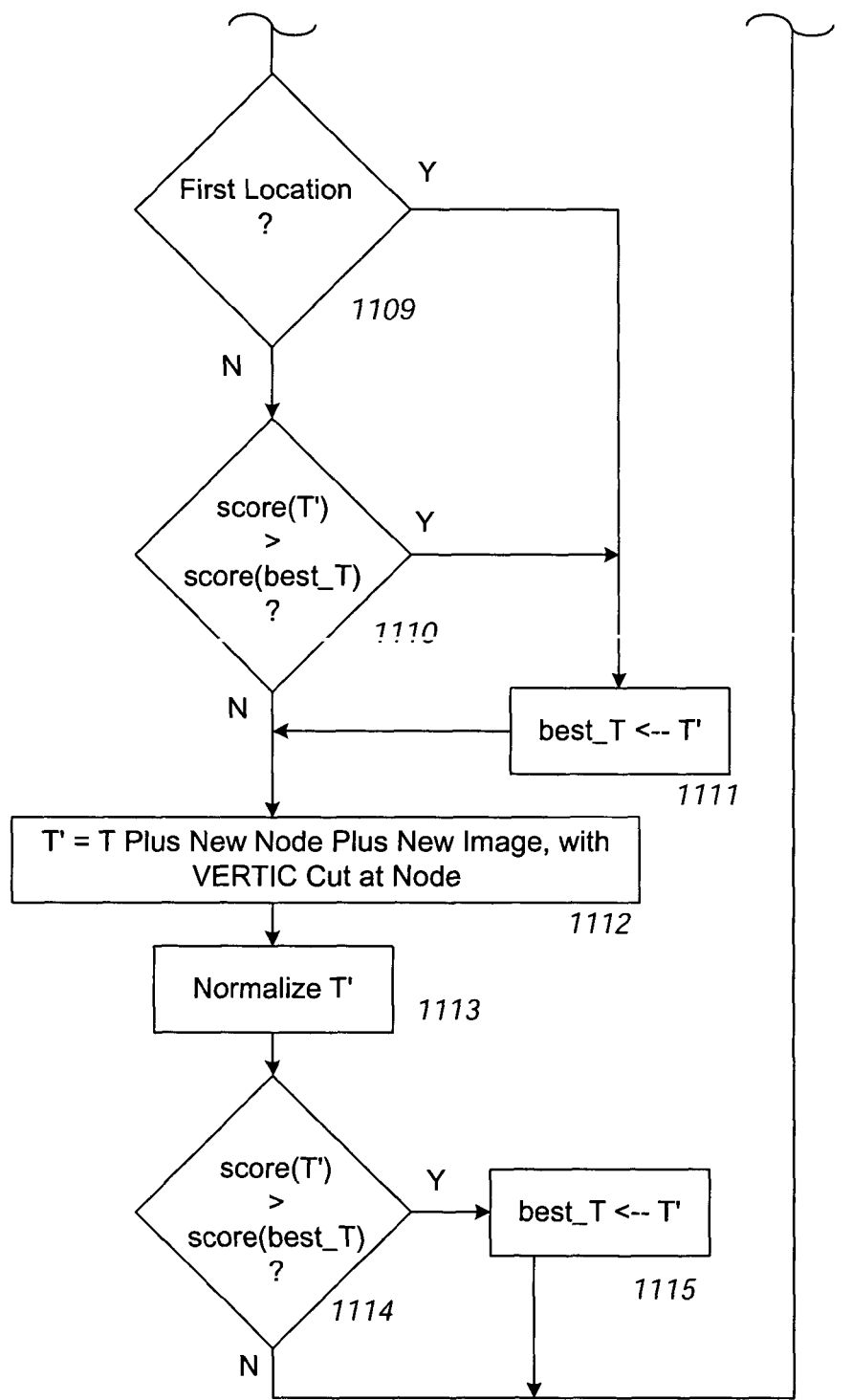
FIG. 11B is the second part of a detailed flowchart of an embodiment of a photo album creation system according to the single pass design.

Specifically, from FIG. 11A, continued on FIG. 11B, element 1101 initializes the layout tree T with one leaf including the first image. Element 1102 normalizes T, where normalizing in this context means operating according to the flowchart of FIG. 14, discussed below. Element 1103 moves T into the best_T slot. Element 1104 evaluates whether no further images are available, i.e. if this is the only image. If this is the only image, best_T is the T entered in element 1104, and the operation ceases. If further images are available at element 1104, element 1105 gets the next image, while element 1106 evaluates the first location in the tree T. The term "location" as used herein may be defined as either a leaf or a node. Element 1107 creates T' as an augmented copy of T, where the augmentation is to add a new node in the place of the location, and with one child of the new node being the subtree of T whose root is the location of T, and with the other child of the new node being the image. In T', a predetermined cut, such as a horizontal cut, is made at the new node. Element 1108 normalizes T'. Decision 1109 determines whether the location is the first location. If this is the first location, T' is shifted into best_T at element 1111 and operation progresses to element 1112. If this is not the first location, element 1110 computes a score for the newly fashioned T' and a score for best_T, where scoring may be performed in the various aforementioned ways or in the manner described below. Element 1110 evaluates whether the resultant score for T' is greater than, or the tree is better than, the resultant score for best_T, indicating an improved layout. If the score of T' is greater than the score of best_T, then T' moves into the best_T position or register and operation moves to element 1112. If the score of T' is not greater than the score of best_T, operation progresses to element 1112.

From FIG. 11B, element 1112 shifts T plus the new node into T', with a different predetermined cut at the location as opposed to the cut of element 1107. The system normalizes T' at element 1113, and again determines scores for T' and best_T at element 1114. Element 1114 may use the same or different scoring method as element 1110, and again if the score of T' is greater than the score of best_T, the system moves modified tree T' into best_T, and operation then progresses to element 1116. If element 1110 indicates the score of T' is not greater than the score of best_T, operation progresses directly to element 1116. Element 1116 determines whether no further locations are available in T. If no further locations are available in T, operation progresses to element 1118. If further nodes are available in T, element 1117 evaluates the next node in T and operation progresses to element 1107 and proceeds as previously discussed. If no further nodes are available in tree T, element 1118 determines whether the page has no more images available for processing. If no more images are available, best_T moves into T in element 1119, and the next image obtained using element 1105. If no further images are available, best_T is the tree made available for image layout.

Figure 12:
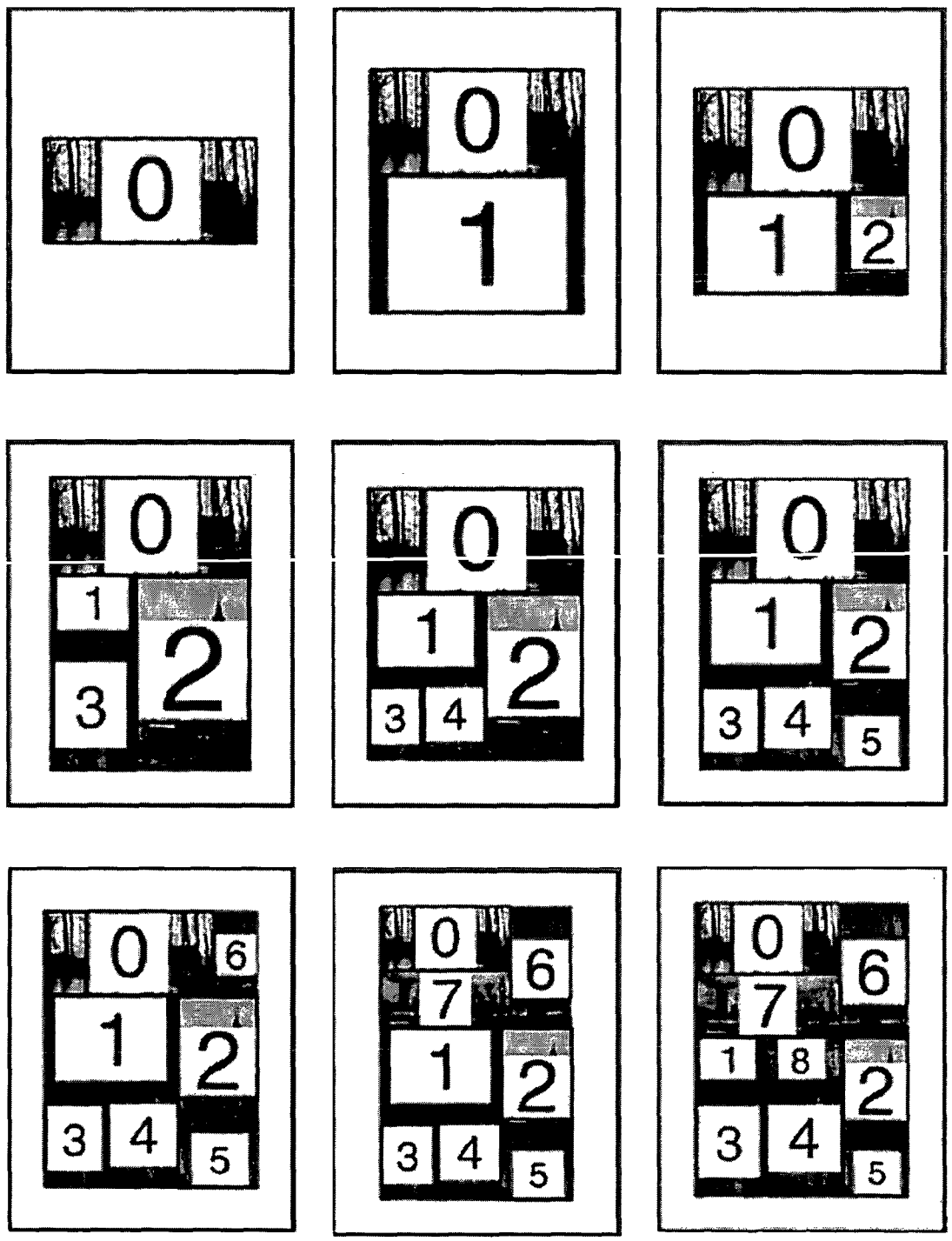
FIG. 12 shows sequential loading of images or objects according to the single pass design.
Figure 13A:
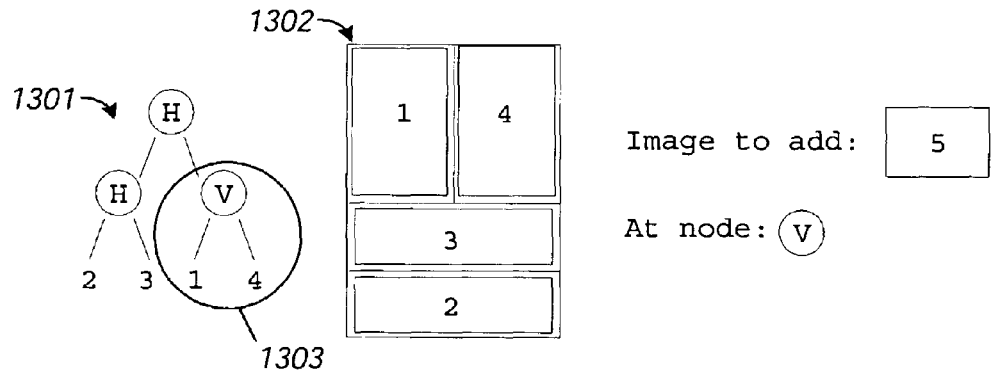
FIG. 13A shows a tree having four associated images and a desire to insert new image 5.
Figure 13B:
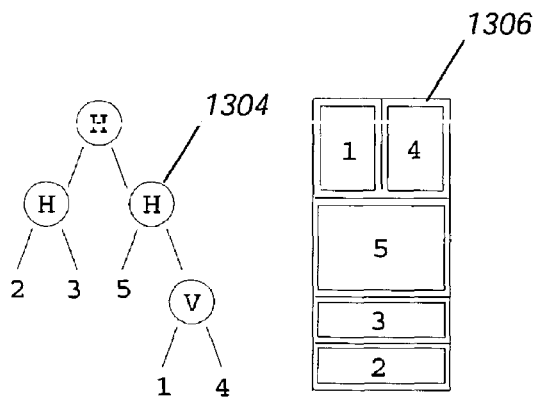
FIG. 13B illustrates locating a new image 5 beneath a new horizontal split node, and locating original images 1 and 4 as children of the new, horizontal split node.
Figure 13C:
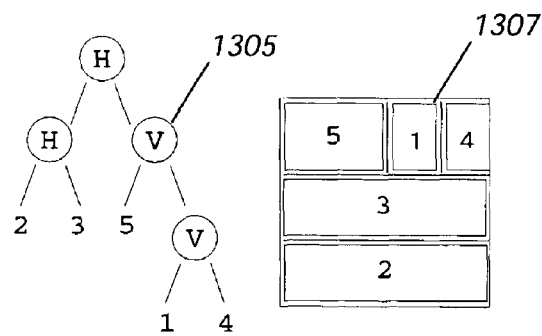
FIG. 13C illustrates locating a new image 5 beneath a new vertical split node and locating original images 1 and 4 as children of the new, vertical split node.

Successive insertions of images according to this design are shown in FIG. 12. Insertion of each image into an existing layout tree structure operates as follows. For a tree T having N images, the system may seek to add the (N+1)-st image. The system inserts the image at a particular location of T in three steps. First, the system removes the subtree rooted at the location, replacing it with a new, node having either horizontal or vertical orientation. FIG. 13A shows a tree 1301 having four associated images and a desire to insert new image 5. The existing image layout without image 5 is shown as layout 1302. FIG. 13B shows replacement of the subtree 1303 with a new node 1304. Second, the system may position the new image as a child of the new node. FIG. 13B shows the new image 5 placed as a child of the new node 1304. Finally, the system positions the subtree of T rooted at the original location as the other child of the new node. From FIG. 13B, the system locates the new image, image 5, next to the subtree of T rooted at the original node, and locates the original images, here images 1 and 4, as children of the new node 1304 because they are included in the subtree 1303. This tree phase process is further illustrated in FIG. 13C. In FIG. 13C, the system inserts the new image at the new "V" node 1305.

Thus, in operation, the system assumes that the original layout, such as that shown in FIG. 13A, has an aspect ratio equal to the aspect of the page. In both the trial layouts of FIGS. 13B and 13C, shown on the page as layouts 1306 and 1307, respectively, the system scales the layout to fit inside a the page. The two trial layouts have a different aspect ratio than the original layout, and all the images in the layout adjust to the new image. The system adjusts existing images in size and not aspect ratio.

Figure 14:
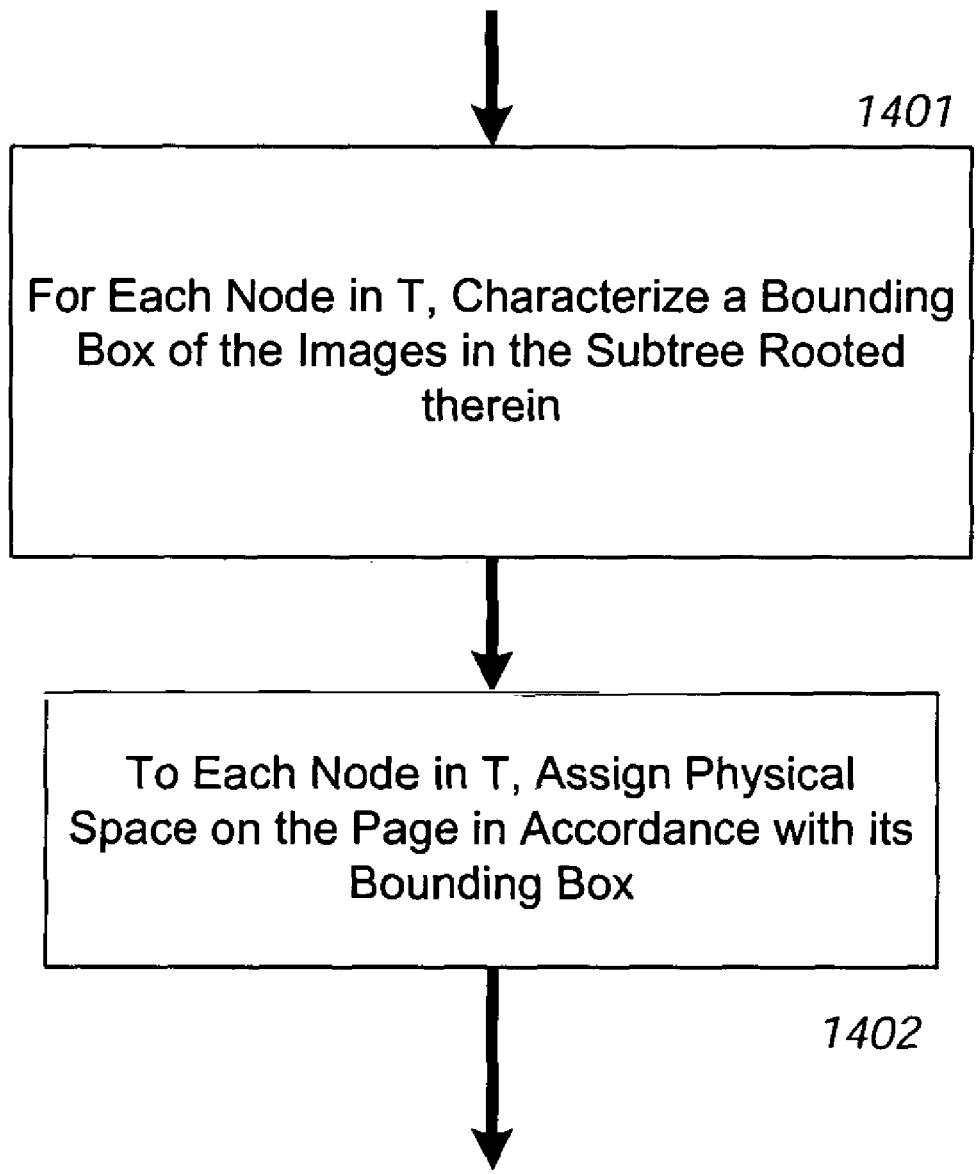
FIG. 14 is a flowchart of the normalization process according to the single pass design.

Normalization of a layout is shown in FIG. 14. In essence, normalization makes the tree layout structure generally consistent with the desired style, such as brick style, and is substantially similar to elements 604 and 605 of FIG. 6 above. From FIG. 14, element 1401 states that for each node in T, the system characterizes a bounding box of the images in the subtree rooted therein. Element 1402 operates by, for each node in T, assigning physical space on the page in accordance with its bounding box. Thus irregularly shaped images, images with captions, and so forth, may be uniformly defined and positioned in a visually acceptable format. Operation of elements 1401 and 1402 are similar or identical to operation of elements 604 and 605.

Once the system has normalized the layout, the layout is scored in element 1110 and subsequently in element 1114. The scoring function may have significant effects on the visual quality of the layout. One scoring function includes two terms, alpha and consistency. Alpha measures how well the aspect ratio of the page agrees with the aspect ratio of the bounding box for the images, a numeric value which may be between, for example, 0 and 1. Consistency may be computed as the area of the smallest photo on the page, divided by the area of the largest photo on the page. For both terms, a value of, for example, 1.0 represents an ideal, and a value of, for example, 0.0 represents the worst available alpha or consistency.

The scoring function may compute and initial score, such as for example ((1.5*alpha)+consistency). Other initial scores may be computed. This initial score may be penalized for values of alpha and/or consistency that are below thresholds, and the system may compare resultant scores for different parameters as specified above.

The foregoing description affords the ability to develop a visually pleasing layout without computing multiple layouts while affording the user the ability to provide certain inputs.

It will be appreciated to those of skill in the art that the present design may be applied to other systems that perform efficient placement functions, such as floorplanning for certain types of objects or items, including scalable items that can vary in size and possibly maintain a fixed aspect ratio. In particular, it will be appreciated that various types of optimal or enhanced placement functions may be addressed by the functionality and associated aspects described herein.

Although there has been hereinabove described a method and for performing efficient image placement on a surface such as a sheet of paper, for the purpose of illustrating the manner in which the invention may be used to advantage, it should be appreciated that the invention is not limited thereto. Accordingly, any and all modifications, variations, or equivalent arrangements which may occur to those skilled in the art, should be considered to be within the scope of the present invention as defined in the appended claims.

What is claimed is:

1. A method for arranging a set of objects within an area, comprising:
   initiating a first current binary tree comprising a leaf node;
   associating a first object selected from the set with the leaf node;
   establishing candidate binary trees, wherein each of the candidate binary trees comprises the current binary tree and a respective leaf node associated with another object selected from the set, and locations of the leaf nodes within each of the candidate binary trees correspond to relative positions of the associated objects within the area;
   computing a respective score for each of the candidate binary trees
   selecting one of the candidate binary trees as the current binary tree based on the computed scores;
   repeating the establishing, the computing, and the selecting until the current binary tree includes all the objects in the set; and
   after the repeating, arranging the objects within the area in accordance with the locations of the leaf nodes within the current binary tree.

2. The method of claim 1, wherein the current binary tree comprises:
   at least one interior node; and
   at least one leaf node emanating from the interior node;
   wherein each subtree of the current binary tree comprises a respective position within the current binary tree and all interior nodes and leaf nodes emanating from the respective position; and
   wherein each subtree of each of the candidate binary trees comprises a respective location within the candidate binary tree and all interior nodes and leaf nodes emanating from the respective location.

3. The method of claim 2, wherein the establishing comprises:
   removing a subtree of the current binary tree associated with a selected position within the current binary tree;
   inserting a new interior node into the current binary tree at the selected position;
   associating either a horizontal or a vertical partition of the area with the new interior node;
   inserting into the binary tree a new leaf node emanating from the new interior node;
   associating the new leaf node with the other object selected from the set; and
   inserting the previously removed subtree back into the binary tree at the new interior node.

4. The method of claim 3, wherein the selected position is selected from the group consisting of:
   a leaf node in the current binary tree; and
   an interior node in the current binary tree.

5. The method of claim 2, further comprising normalizing each of the candidate binary trees, wherein the normalizing comprises:
   for each of the interior nodes in the candidate binary tree, characterizing a respective bounding box for the objects included in the subtree rooted in the interior node; and
   for each of the objects, allocating a respective region of the area in accordance with the respective bounding box.

6. The method of claim 1, wherein the computing comprises determining respective fractions of the areas occupied by the objects in each of the candidate binary trees, and the selecting comprises selecting as the current binary tree the candidate binary tree having a greatest one of the fractions of the area occupied by the objects in the candidate binary tree.

7. The method of claim 1, wherein the computing comprises assessing minimum and maximum object size values for all the objects in the area, and the selecting comprises selecting as the current binary tree the candidate binary tree having a greatest respective ratio of minimum area object size value divided by maximum area object size value.

8. A method for arranging a set of objects within an area, comprising:
   establishing a tree structure;
   associating a first object selected from the set with the tree structure to form a current candidate tree;
   modifying the current candidate tree to form alternate candidate trees by associating a subsequent object selected from the set with different respective locations on the current candidate tree, wherein the respective locations correspond to relative positions of the associated objects within the area;
   computing scores for each of the alternate candidate trees;
   selecting one of the alternate candidate trees as the current candidate tree based on the computed scores;
   repeating the modifying, the computing, and the selecting until all the objects in the set are associated with the current candidate tree; and
   after the repeating, arranging all the objects in the set within the area in accordance with the locations in the current candidate tree associated with the objects.

9. The method of claim 8, wherein each of the tree structure, the candidate trees, and the alternate candidate trees comprises:
   at least one interior node; and
   at least one leaf node emanating from the interior node;
   wherein each subtree of the current candidate tree comprises a respective location within the current candidate tree and all interior nodes and leaf nodes emanating from the respective location;
   wherein each subtree of each of the alternate candidate trees comprises a respective spot within the alternate candidate tree and all interior nodes and leaf nodes emanating from the spot.

10. The method of claim 9, wherein the modifying comprises:
removing a subtree of the current candidate tree associated with one selected location within the current candidate tree;
inserting a new interior node into the current candidate tree at the selected location;
associating either a horizontal or a vertical partition of the area with the new interior node;
inserting into the current candidate tree a new leaf node emanating from the new node;
associating the new leaf node with the subsequent object selected from the set; and
inserting the previously removed subtree back into the current candidate tree at the new interior node.

11. The method of claim 10, wherein the selected location is selected from the group consisting of: a leaf node in the current candidate tree; and an interior node in the current candidate tree.

12. The method of claim 9, further comprising normalizing each of the alternate candidate trees, wherein for each of the alternate candidate trees the normalizing comprises:
for each of the interior nodes in the alternate candidate tree, characterizing a respective bounding box for the objects included in the subtree rooted in the interior node; and
for each of the objects, allocating a respective region of the area in accordance with the respective bounding box.

13. The method of claim 8, wherein the computing comprises determining respective fractions of the area occupied by the objects in each of the alternate candidate trees, and the selecting comprises selecting as the current candidate tree the alternate candidate tree having a greatest one of the fractions of the area occupied by the objects in the alternate candidate tree.

14. The method of claim 8, wherein the computing comprises assessing minimum and maximum object size values for all objects in the area for each alternate candidate tree, and the selecting comprises selecting as the current candidate tree the alternate candidate tree having a greatest respective ratio of minimum object size value divided by maximum object size value.

15. A method for arranging a set of objects within an area, comprising:
establishing a current candidate tree having at least one interior node, at least one leaf node connected to the interior node, and at least one object selected from the set associated with the leaf node;
modifying the current candidate tree to form alternate candidate trees by associating a subsequent object selected from the set with a different respective location on the current candidate tree, wherein the respective locations correspond to relative positions of the associated objects within the area;
computing scores for each of the alternate candidate trees;
selecting one of the alternate candidate trees as the current candidate tree based on the computed scores;
repeating the modifying, the computing, and the selecting until all the objects in the set are associated with the current candidate tree; and
after the repeating, arranging all the objects in the set within the area in accordance with the locations in the current candidate tree associated with the objects.

16. The method of claim 15, wherein each subtree of the current candidate tree comprises a respective location within the current candidate tree and all interior nodes and leaf nodes emanating from the respective location, and each subtree of each of the alternate candidate trees comprises a respective spot within the alternate candidate tree and all interior nodes and leaf nodes emanating from the respective spot.

17. The method of claim 16, wherein modifying the candidate tree comprises:
removing a subtree of the current candidate tree associated with one selected location within the current candidate tree;
inserting a new interior node into the current candidate tree at the selected location;
associating either a horizontal or a vertical partition of the area with the new interior node;
inserting into the candidate tree a new leaf node emanating from the new interior node;
associating the new leaf node with the subsequent object selected from the set; and
inserting the previously removed subtree back into the candidate tree at the new interior node.

18. The method of claim 17, wherein the selected location is selected from the group consisting of:
a leaf node in the current candidate tree; and
an interior node in current the candidate tree.

19. The method of claim 16, further comprising normalizing each of the alternate candidate trees, wherein for each of the alternate candidate trees the normalizing comprises:
for each of the interior nodes in the alternate candidate tree, characterizing a respective bounding box for the objects included in the subtree rooted in the interior node; and
for each of the objects, allocating a respective region of the area in accordance with the respective bounding box.

20. The method of claim 15, wherein the computing comprises determining respective fractions of the area occupied by the objects in each of the alternate candidate trees, and the selecting comprises selecting as the current candidate tree the alternate candidate tree having a greatest one of the fractions of the area occupied by the objects in the alternate candidate tree.

21. The method of claim 15, wherein the computing comprises assessing minimum and maximum object size values for all objects in the area for each of the alternate candidate trees, and the selecting comprises selecting as the current candidate tree the alternate candidate tree having a greatest respective ratio of minimum object size value divided by maximum object size value.

* * * * *

UNITED STATES PATENT AND TRADEMARK OFFICE
CERTIFICATE OF CORRECTION

| | | |
|---|---|---|
| PATENT NO. | : 8,065,627 B2 | Page 1 of 1 |
| APPLICATION NO. | : 10/675823 | |
| DATED | : November 22, 2011 | |
| INVENTOR(S) | : C. Brian Atkins | |

It is certified that error appears in the above-identified patent and that said Letters Patent is hereby corrected as shown below:

In column 18, line 32, in Claim 18, delete "current the" and insert -- the current --, therefor.

Signed and Sealed this
Eleventh Day of September, 2012

David J. Kappos
*Director of the United States Patent and Trademark Office*